(12) United States Patent
Sung et al.

(10) Patent No.: US 10,580,651 B2
(45) Date of Patent: Mar. 3, 2020

(54) INTEGRATION OF DEVICE REGIONS

(71) Applicant: Applied Materials, Inc., Santa Clara, CA (US)

(72) Inventors: Min Gyu Sung, Essex, MA (US); Sony Varghese, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 4 days.

(21) Appl. No.: 16/003,902

(22) Filed: Jun. 8, 2018

(65) Prior Publication Data

US 2019/0378717 A1 Dec. 12, 2019

(51) Int. Cl.
*H01L 29/06* (2006.01)
*H01L 21/033* (2006.01)

(52) U.S. Cl.
CPC ...... *H01L 21/0338* (2013.01); *H01L 21/0335* (2013.01); *H01L 21/0337* (2013.01)

(58) Field of Classification Search
CPC ............. H01L 21/0337; H01L 21/0338; H01L 21/31144; H01L 21/0335; H01L 21/266; H01L 21/76232; H01L 21/76283; H01L 2924/141; H01L 2924/1431
USPC ....................................................... 257/618
See application file for complete search history.

(56) References Cited

U.S. PATENT DOCUMENTS

| | | | |
|---|---|---|---|
| 8,835,328 B2 * | 9/2014 | Hwang | H01L 29/66795 438/694 |
| 9,472,464 B1 | 10/2016 | Zeng et al. | |
| 9,627,389 B1 | 4/2017 | Woo et al. | |
| 9,786,497 B2 * | 10/2017 | Cheng | H01L 21/02532 |
| 2017/0271163 A1 | 9/2017 | Sung et al. | |

* cited by examiner

*Primary Examiner* — Theresa T Doan
(74) *Attorney, Agent, or Firm* — Patterson + Sheridan, LLP

(57) ABSTRACT

The present disclosure relates to a method for creating regions of different device types on a substrate having different pitches. The method includes dividing a substrate into a first device type region and a second device type region. The method further includes forming a target etch layer on the substrate. The method further includes forming a bottom mandrel layer on the target etch layer. The method further includes forming a plurality of alternating first pillars of a top mandrel material and first trenches between the first pillars on the bottom mandrel layer in the first device type region. The plurality of first pillars has a first pitch. The method further includes forming a plurality of alternating second pillars of the top mandrel material and second trenches between the second pillars on the bottom mandrel layer in the second device type region. The plurality of second pillars has a second pitch. The method further includes depositing tone inversion material in the first trenches.

10 Claims, 29 Drawing Sheets

INTEGRATION OF DEVICE REGIONS

BACKGROUND

Field

The present disclosure relates generally to designing and fabricating integrated circuit (IC) devices. The present disclosure is particularly applicable to forming fins in multiple co-integrated device regions of different types on a substrate and having different pitch widths.

Description of the Related Art

Generally, in the fabrication of IC devices, lithography processes may be utilized to print/pattern cavities, trenches, recessed-areas, and other elements for creating various components and circuits. Various process operations, such as etching, may then be performed on the underlying layer of material or substrate through patterned block or cut masks. However, with advancements in processes utilized to manufacture IC devices as well as industry demand for more efficient and smaller sized devices, physical dimensions of the elements as well as their proximity to each other are reduced. As a result, spaces (a pitch) between adjacent elements may be reduced causing a reduction in error tolerance/thresholds in various fabrication processes.

There is a need in the art for obtaining smaller pitches, and in particular, for integrating logic devices (hereinafter "SG devices") formed in a general logic area having minimum fin pitch with analog/I/O devices (hereinafter "EG devices") formed in an analog logic area having larger fin pitch than the SG devices. Techniques for obtaining very small pitch widths include spacer patterning. Spacer patterning is a technique employed for patterning features with linewidths smaller than can be achieved by conventional lithography. A spacer is a layer that is deposited over a pre-patterned feature, called the mandrel. The spacer is subsequently etched back so that the spacer portion covering the mandrel is etched away while the spacer portion on the sidewall remains. The mandrel may then be removed, leaving two spacers (one for each edge) for each mandrel. Since there are two spacers for every line, the line density has now doubled, which is referred to as Self-Aligned Double Patterning (SADP). The SADP technique is applicable for defining narrow gates at half the original lithographic pitch, for example. When SADP is repeated, an additional halving of the pitch is achieved. This is referred to Self-Aligned Quadruple Patterning (SAQP).

Unfortunately, when integrating SG and EG device regions on the same substrate using SAQP for one device region and SADP for another device region with a different pitch, conventional application of SAQP and SADP becomes problematic. Conventional attempts at integration of SG and EG device regions using SAQP employ amorphous carbon (aCarbon) as a top mandrel material, and for a subsequent lithographic patterning step, an optical planarization layer (OPL) is employed. Unfortunately, OPL is often made of carbon contained organic materials, which does not have an etch selectivity to the aCarbon layer. To have two different pitches, different top spacer oxide thicknesses are required, which requires a removal of top spacer in one region, then the other region. After $SiO_2$ is removed in the SG region, the top mandrel (aCarbon) in the SG region cannot be protected by an OPL strip process in the EG region, since the top mandrel aCarbon and OPL are similar materials. Therefore, two separate applications of SAQP are required using aCarbon mandrel material, which is expensive and difficult to carry out.

SUMMARY

The present disclosure generally relates to a method to create regions of different device types on a substrate having different pitches between the regions of different device types. The method includes dividing a substrate into a first device type region and a second device type region. The method further includes forming a target etch layer on the substrate. The method further includes forming a bottom mandrel layer on the target etch layer. The method further includes forming a plurality of alternating first pillars of a top mandrel material and first trenches between the first pillars on the bottom mandrel layer in the first device type region. The plurality of first pillars has a first pitch. The method further includes forming a plurality of alternating second pillars of the top mandrel material and second trenches between the second pillars on the bottom mandrel layer in the second device type region. The plurality of second pillars has a second pitch. The method further includes depositing tone inversion material in the first trenches.

The present disclosure further relates to a method for creating regions of different device patterning types on a substrate having different pitches. The method includes dividing a substrate into a first device patterning type region and a second device patterning type region. The method further includes forming a target etch layer on the substrate. The method further includes forming a bottom mandrel layer on the target etch layer. The method further includes forming a plurality of first pillars of a top mandrel material on the bottom mandrel layer in the first device type region and having a first pitch. The method further includes forming a plurality of first spacers along the sidewalls of each of the plurality of first pillars. The method further includes forming an optical planarization layer (OPL) over the plurality of first pillars, the plurality of first spacers, and a top surface of the bottom mandrel layer in the first device patterning type region. The method further includes forming a plurality of second pillars of the top mandrel material on the bottom mandrel layer in the second device patterning type region and having a second pitch. The method further includes implanting a dopant on top surfaces and sidewalls of the plurality of second pillars to form implanted pillars in the second device patterning type region.

The present disclosure further relates to a semiconductor structure. The semiconductor structure includes a substrate divided into a first device type region and a second device type region. A target etch layer is formed on the substrate. A bottom mandrel layer is formed on the target etch layer. A plurality of alternating first pillars of a top mandrel material and first trenches between the first pillars on the bottom mandrel layer are formed in the first device type region, the plurality of first pillars having a first pitch. A plurality of alternating second pillars of the top mandrel material and second trenches between the second pillars on the bottom mandrel layer are formed in the second device type region, the plurality of second pillars having a second pitch. Tone inversion material is formed in the first trenches.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
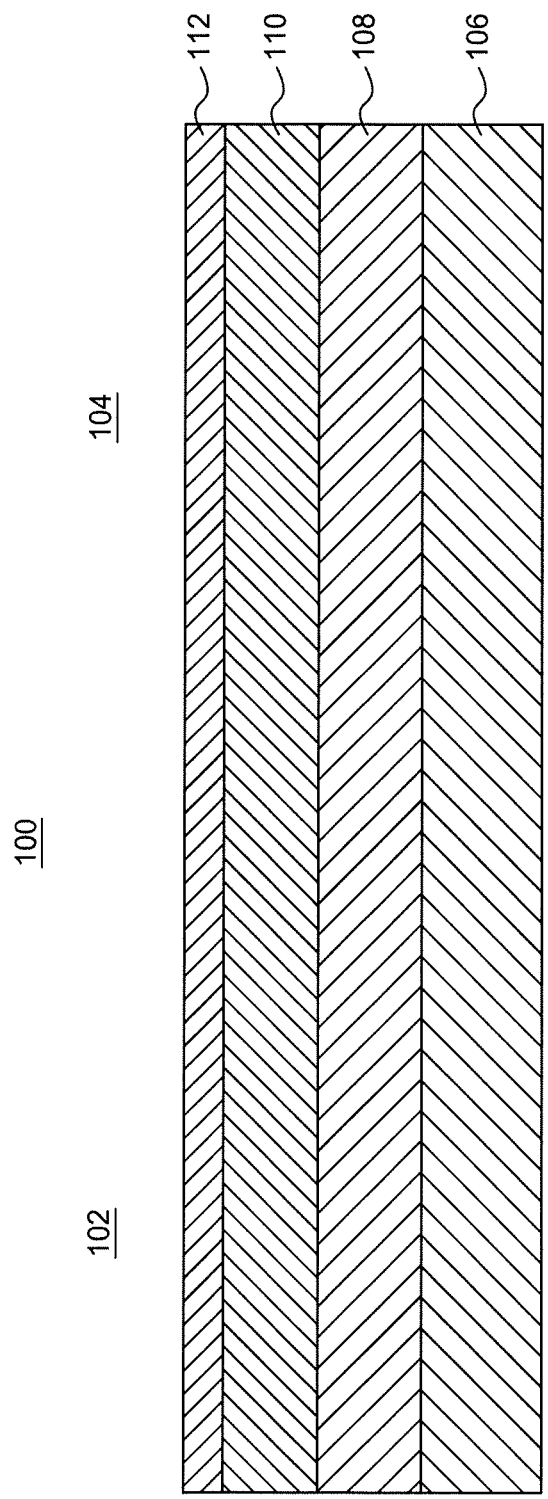
FIG. 1 is a cross-sectional view of an initial semiconductor structure according to a first embodiment to create regions of different device types on a substrate having different pitches.

FIG. 1 is a cross-sectional view of an initial semiconductor structure 100 according to a first embodiment to create regions of different device types on a substrate having different pitches. The initial semiconductor structure 100 is formed over a substrate (not shown for illustrative convenience) in each of SG device region 102 and EG device region 104. The SG device region 102 is to have a smaller pitch than the EG device region 104. Each of device regions 102, 104 are patterned at the same time (The SG device region 102 and EG device region 104 are shown separately, but are actually part of the same stack on the same substrate). The initial semiconductor structure 100 further includes a target etch layer 106 for forming fins over the substrate (not shown), a bottom mandrel layer 108 formed over the target etch layer 106, a top mandrel layer 110 formed over the bottom mandrel layer 108, and a litho-assist layer 112 formed over the top mandrel layer 110. (A mandrel layer is a temporary sacrificial layer employed then removed between patterning steps). The top mandrel layer 110 is to be employed in a first spacer patterning step to obtain a two times reduction of pitch, and the bottom mandrel layer 108 is to be employed in a second spacer patterning step to obtain a four times reduction of pitch.

The target etch layer 106 is formed of a silicon nitride hard mask and silicon material such as SiN, Si, or SiGe to a thickness of 25 to 45 nanometers (nm) each. The bottom mandrel layer 108 and the top mandrel layer 110 are made of different materials (i.e. heterogenous). The bottom mandrel layer 108 is formed of amorphous silicon (a-Si) to a thickness of 40 to 60 nm, and the top mandrel layer 110 is formed of amorphous carbon (aC) to a thickness of 20 to 40 nm. The litho-assist layer 112 is formed of silicon oxynitride (SiON) to a thickness of 10 nm to 30 nm. The layers 106, 108, 110, 112 can be deposited using any suitable deposition technique, e.g., chemical vapor deposition (CVD) or physical vapor deposition (PVD).

Figure 2:
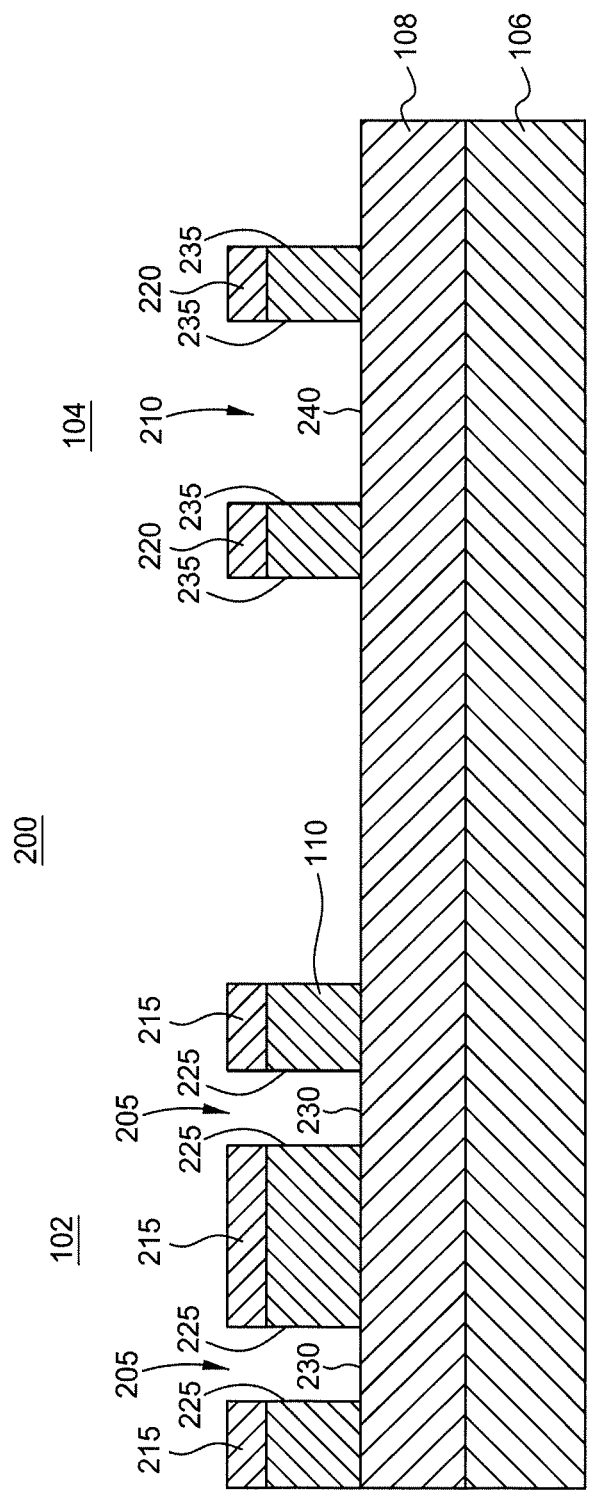
FIG. 2 is a cross-sectional side view of a semiconductor structure corresponding to the initial semiconductor structure of FIG. 1 after forming first trenches in an SG device region and second trenches in an EG device region.

FIG. 2 is a cross-sectional side view of a semiconductor structure 200 corresponding to the initial semiconductor structure 100 of FIG. 1 after forming first trenches 205 in the SG device region 102 and second trenches 210 in the EG device region 104. Forming the first trenches 205 and the second trenches 210 may be effected using a lithographic patterning process and an etching process. The etch process, may be, but is not limited to, e.g., a reactive-ion etching (RIE). The first trenches 205 have side walls 225 and bottom walls 230 and the second trenches have sidewalls 235 and bottom walls 240. The litho-assist layer 112 and the top mandrel layer 110 are etched selective to the bottom mandrel layer 108. The trenches 205, 210 alternate with patterned pillars 215 in the SG device region 102 and 220 in the EG device region 104. The spacing or pitch between the pillars 215 is larger than that of the pillars 220. The patterning and spacing in the SG device region 102 has a pillar 215 where the EG device region 104 has a trench 210 to facilitate the creation of an inversion layer as described hereinbelow with respect to FIGS. 6A-6D.

Figure 3:
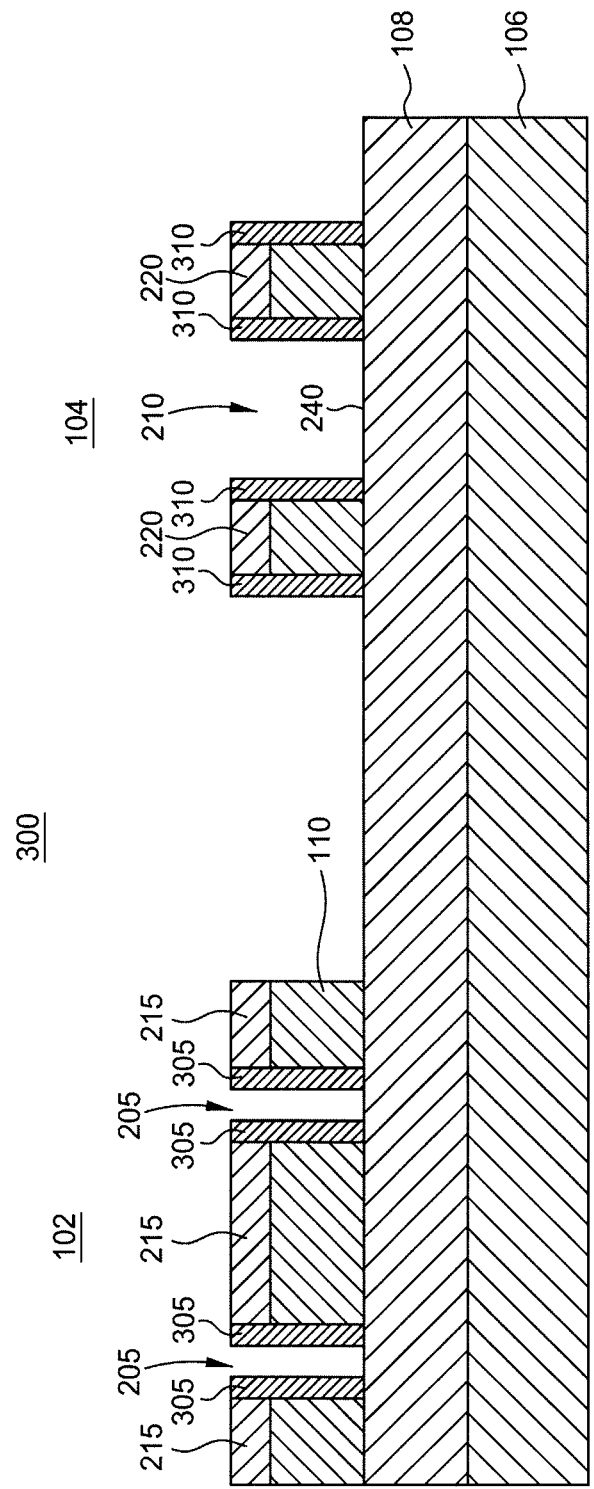
FIG. 3 is a cross-sectional side view of a semiconductor structure corresponding to the semiconductor structure of FIG. 2 after forming spacers along sidewalls of pillars.

FIG. 3 is a cross-sectional side view of a semiconductor structure 300 corresponding to the semiconductor structure 200 of FIG. 2 after forming spacers 305, 310 along the sidewalls 225 of the pillars 215 and the sidewalls of the pillars 220, respectively. Forming the spacers 305, 310 may be affected by a deposition process (e.g., atomic layer deposition (ALD)) and an etching process (e.g., RIE). The spacers 305 are located on the inner sidewalls 225 of the pillars 215 within the first trenches 205 and rise from the bottom walls 230 located on the bottom mandrel layer 108 and adjoining the sidewalls 225 to the litho-assist layer 112. The spacers 310 are located on the outer sidewalls 235 of the pillars 220 internal and external to the second trenches 210 and rise from the bottom walls 240 located on the bottom mandrel layer 108 and adjoining the sidewalls 225 to the litho-assist layer 112. The spacers 305, 310 may be made of silicon dioxide ($SiO_2$). The spacers 305, 310 may have a thickness between 10 nm and 30 nm.

Figure 4:
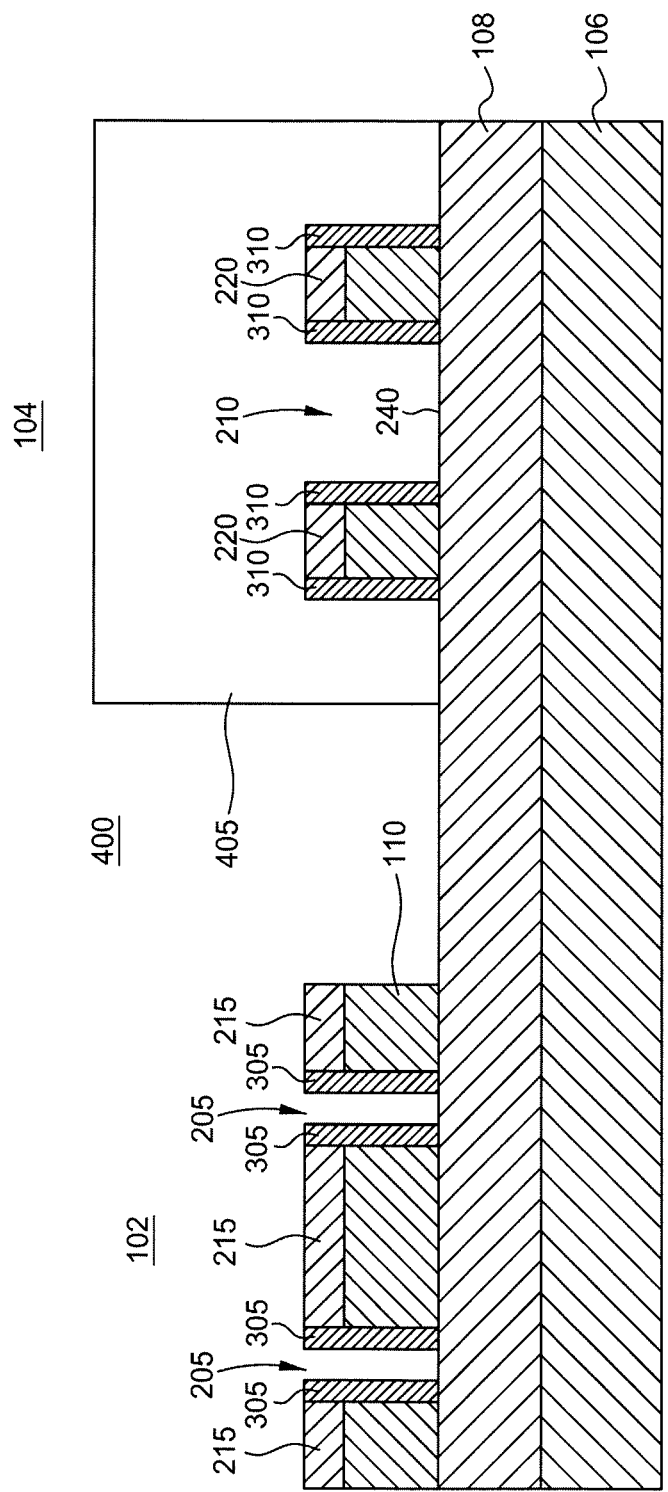
FIG. 4 is a cross-sectional side view of a semiconductor structure corresponding to the semiconductor structure of FIG. 3 after conformally depositing an optical planarization layer (OPL) by a photo-lithography process.

FIG. 4 is a cross-sectional side view of a semiconductor structure 400 corresponding to the semiconductor structure 300 of FIG. 3 after conformally depositing an optical planarization layer (OPL) 405 over the spacers 310 by a photo-lithography process, the litho-assist layer 112 and a top surface 410 of the bottom mandrel layer 108 in the EG device region 104 but not the SG device region 102. The OPL 405 is made of carbon contained organic materials, which do not have an etch selectivity to the (aCarbon) bottom mandrel layer 108. The OPL 405 is a typical planarization layer which is widely used for conventional photo-lithographic processes. The OPL 405 may be formed to a thickness of 100 nm to 400 nm.

Figure 5:
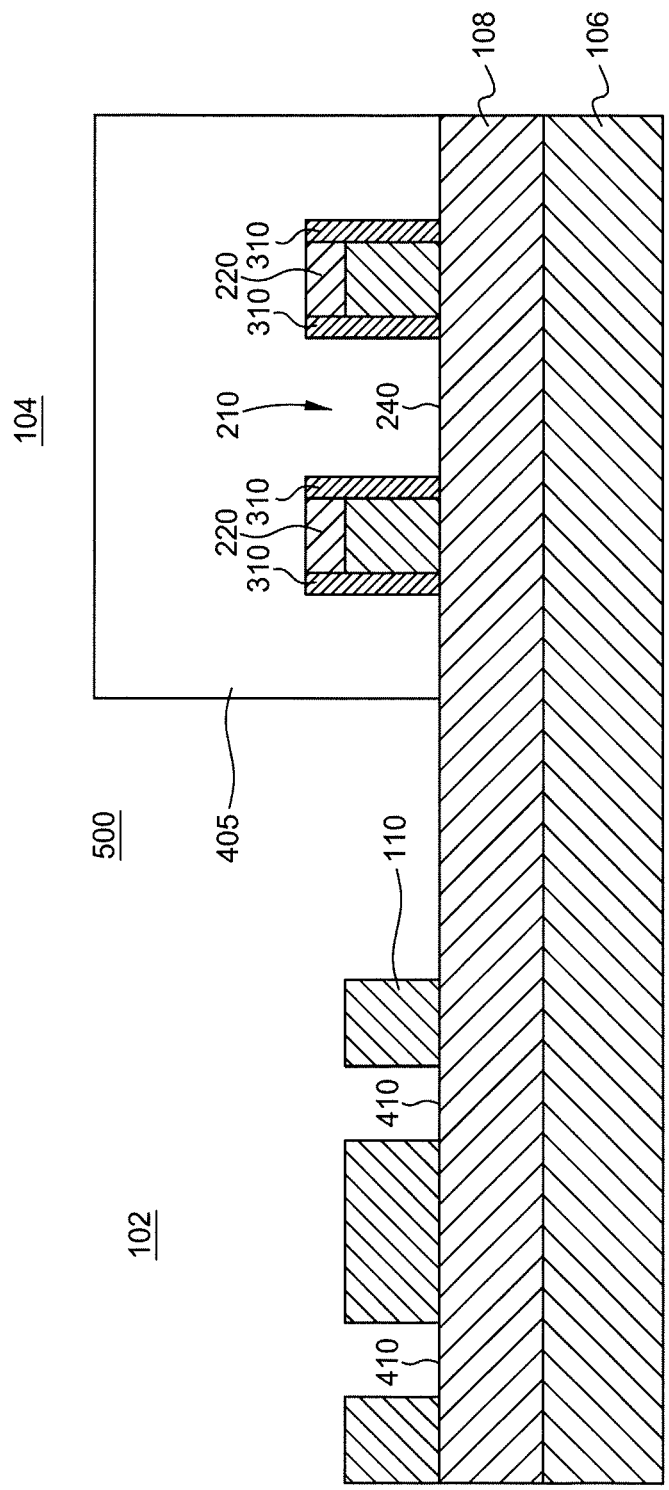
FIG. 5 is a cross-sectional side view of a semiconductor structure corresponding to the semiconductor structure of FIG. 4 after removing the spacers and the litho-assist layer in the SG device region.

FIG. 5 is a cross-sectional side view of a semiconductor structure 500 corresponding to the semiconductor structure 400 of FIG. 4 after removing the spacers 305 and the litho-assist layer 112 in the SG device region 102. The removal may be performed using an etch process (e.g., RIE). The etch process is selective to the aCarbon of the pillars 215 and the upper surface 410 of the a-Si bottom mandrel layer 108.

Figure 6A:
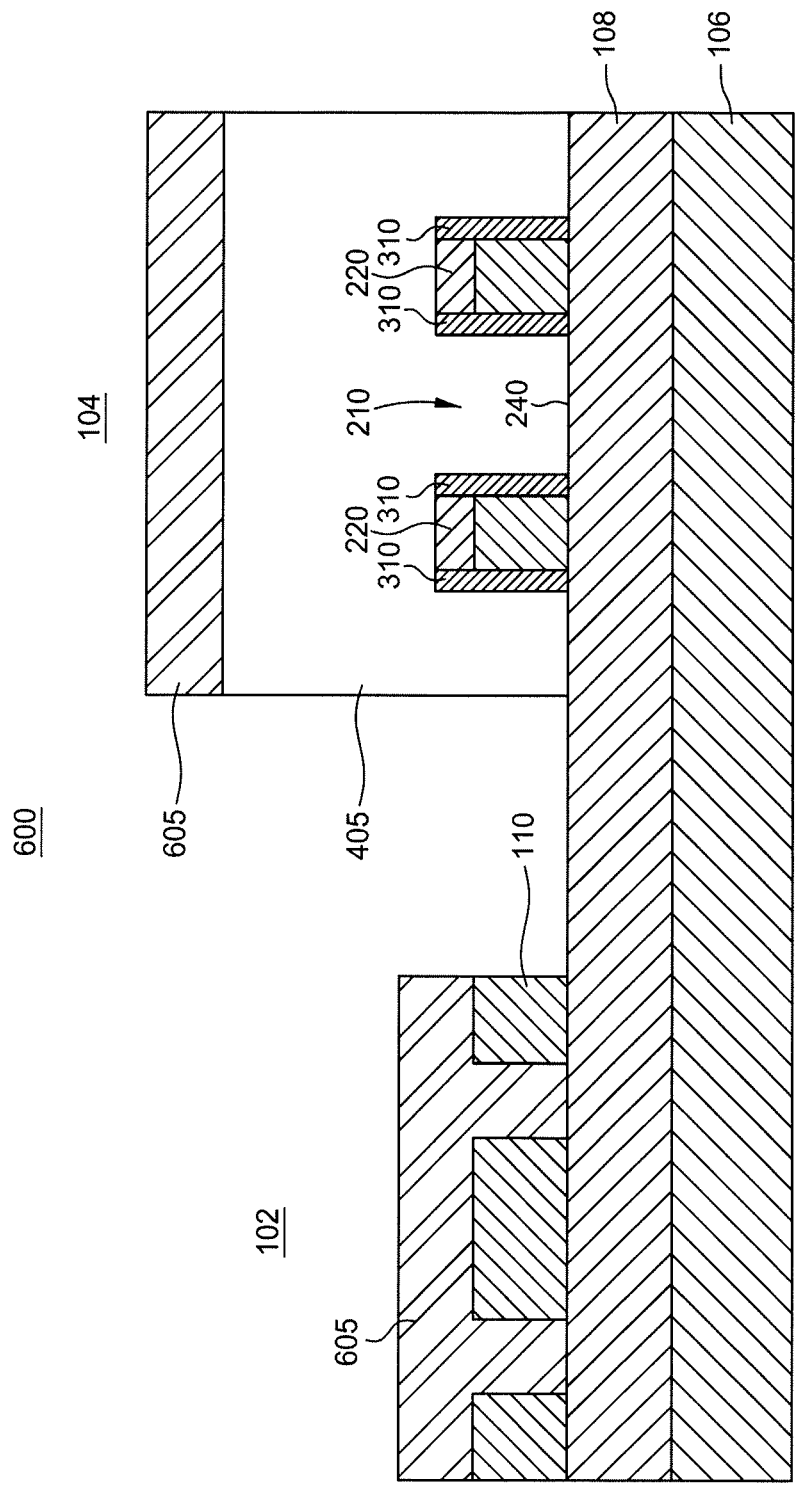
FIG. 6A is a cross-sectional side view of a semiconductor structure corresponding to the semiconductor structure of FIG. 5 after conformally depositing a tone inversion material.

FIG. 6A is a cross-sectional side view of a semiconductor structure 600 corresponding to the semiconductor structure 500 of FIG. 5 after conformally depositing a tone inversion material over the pillars 215, 220 and the trenches 205, 210 in the SG device region 102 and over a top surface of the OPL 405 in the EG device region 104 to form a tone inversion layer 605. The tone inversion material of the tone inversion layer 605 may be SiCO or SiN.

Figure 6B:
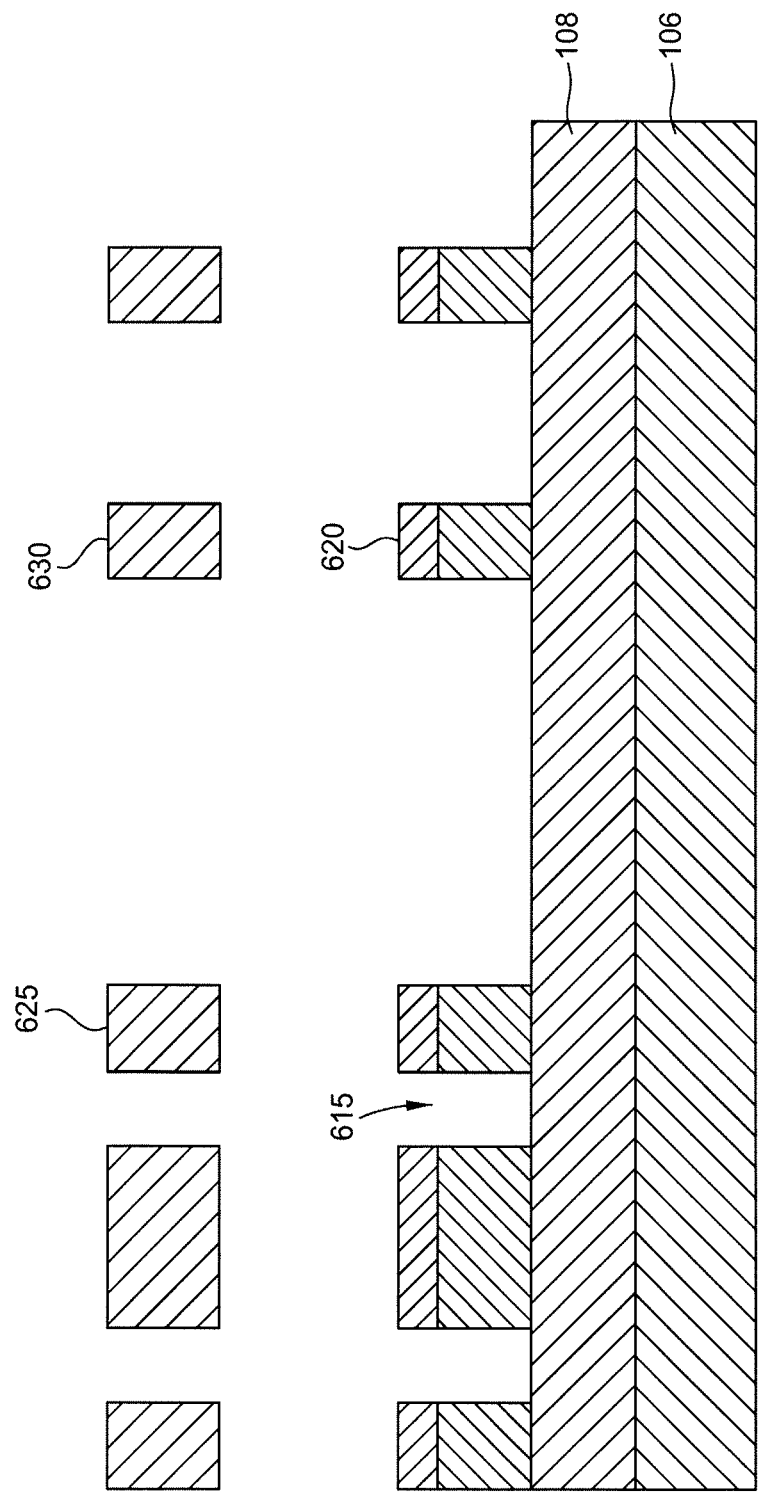
FIG. 6B illustrates a tone inversion process to be employed hereinbelow with respect to FIGS. 7 and 8.

Referring now to the top portion of FIG. 6B, the SG device region 102 has a mask 625 having a tone that is the inverse tone of that used in the mask 630 in the EG device region 104. The photo mask tone is said to be opposite for the SG device region 102 and the EG device region 104 as exhibited in FIG. 2.

Referring again to FIG. 6A, the reason for forming the tone inversion layer 605 in the SG device region 102 as compared to the EG device region 104 is to have two different pitches in each of the regions 102, 104, wherein different top spacer oxide thicknesses are required in each of the regions 102, 104, which requires a removal of top spacer oxide in one of the regions 102, 104 through a lithographic process. After removal of the $SiO_2$ spacers 305 in the SG device region 102, the top mandrel layer 110 in the SG region 102 is not protected from an OPL stripping process, since the top mandrel layer 110 resides in both the SG device region 102 and the EG device region 104. By performing a tone inversion in the SG device region 102, the SG device region 102 can have a different top mandrel material, which can have good etch selectivity during an OPL stripping process.

Figure 7:
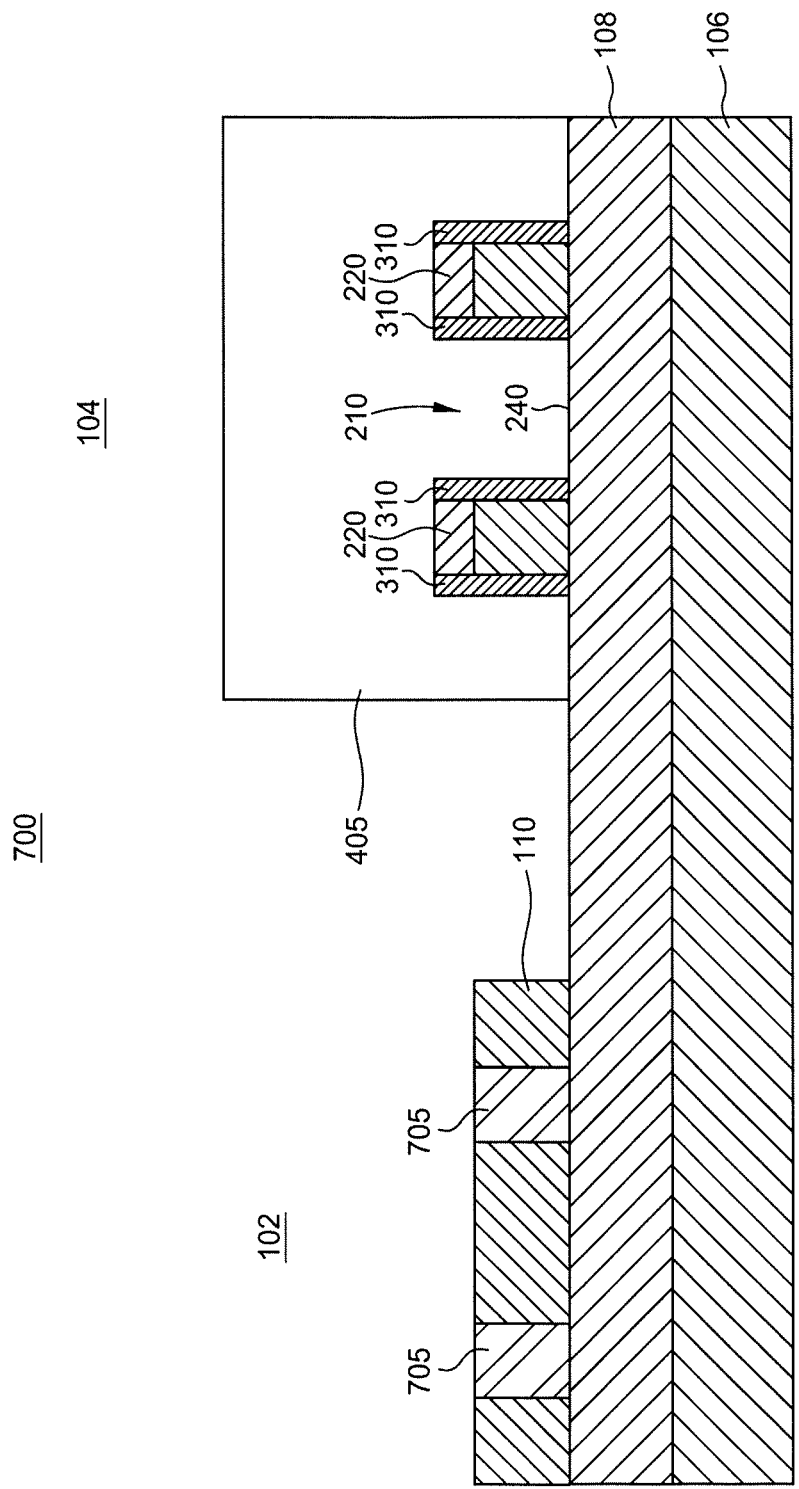
FIG. 7 is a cross-sectional side view of a semiconductor structure corresponding to the semiconductor structure of FIG. 6 after removing tone inversion material over the pillars.

FIG. 7 is a cross-sectional side view of a semiconductor structure 700 corresponding to the semiconductor structure 600 of FIG. 6 after removing tone inversion material over the pillars 215, 220. The removal may be performed using an etch process (e.g., RIE). The tone inversion material 705 remains in the trenches 220 in the SG device region 102. The tone inversion material is also etched back overlying the top surface of the OPL 405 in the EG device region 104.

Figure 8:
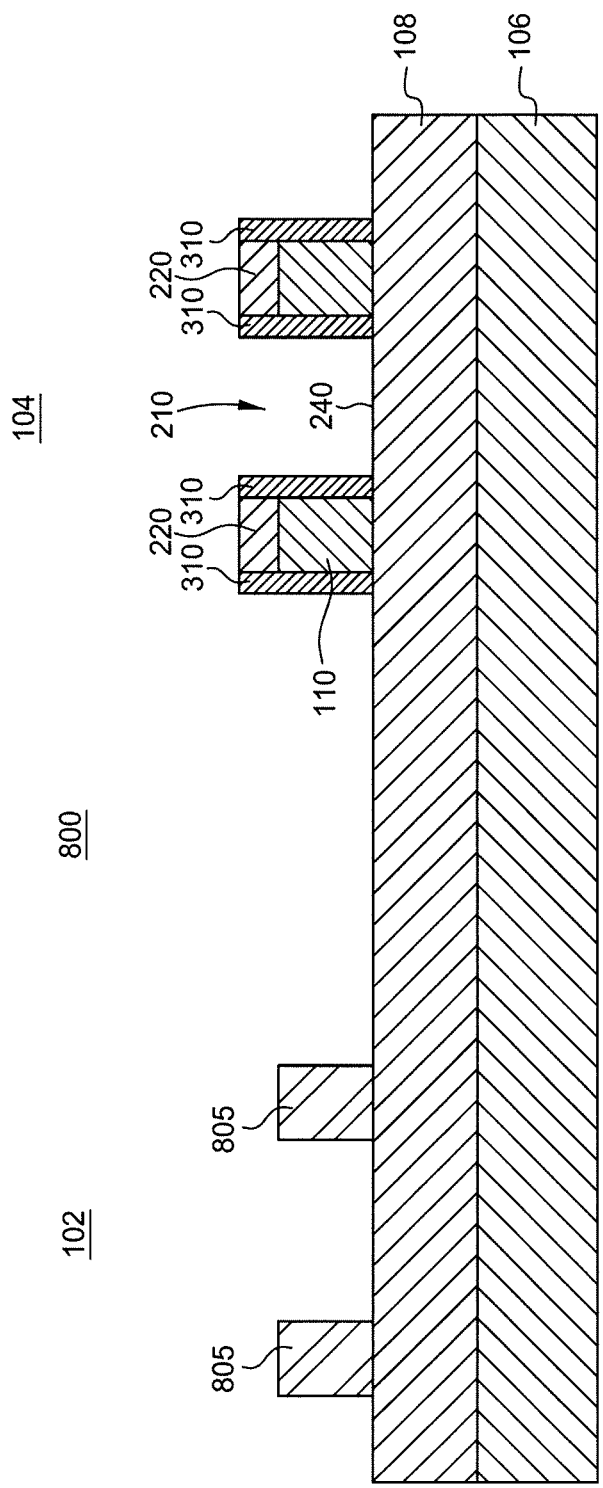
FIG. 8 is a cross-sectional side view of a semiconductor structure corresponding to the semiconductor structure of FIG. 7 after removing the remaining top mandrel material of the pillars.

FIG. 8 is a cross-sectional side view of a semiconductor structure 800 corresponding to the semiconductor structure 700 of FIG. 7 after removing the remaining top mandrel material of the pillars 215, 220 with RE selective to the bottom mandrel layer 108 in the SG device region 102 and removing the OPL 405 about the pillars 220 and the bottom mandrel layer 108 in the EG device region 104. Removing the pillars 215 of the top mandrel material leaves tone-inverted pillars 805 of inversion layer material in the SG device region 102. The spacers 310 and the litho-assist layer 1126 remain and surround the pillars 220 of top mandrel material in the EG device region 104.

Figure 9:
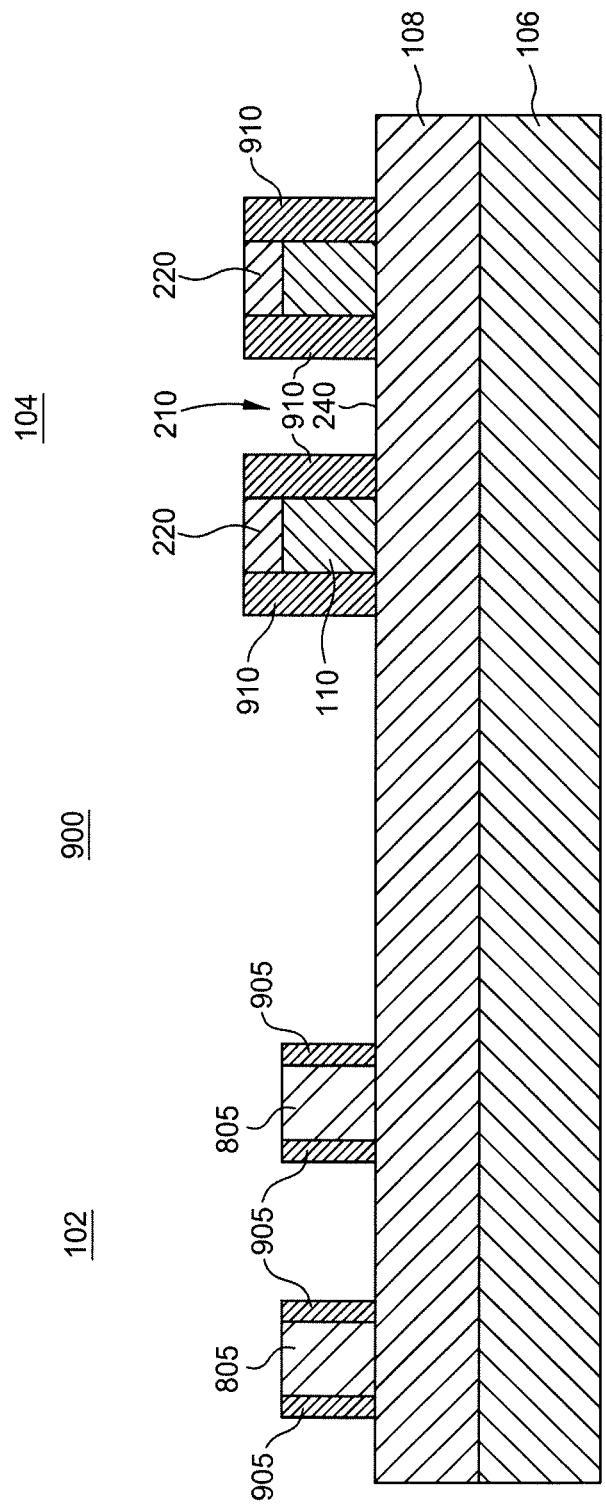
FIG. 9 is a cross-sectional side view of a semiconductor structure corresponding to the semiconductor structure of FIG. 8 after forming spacers along the sidewalls of the pillars.
Figure 10:
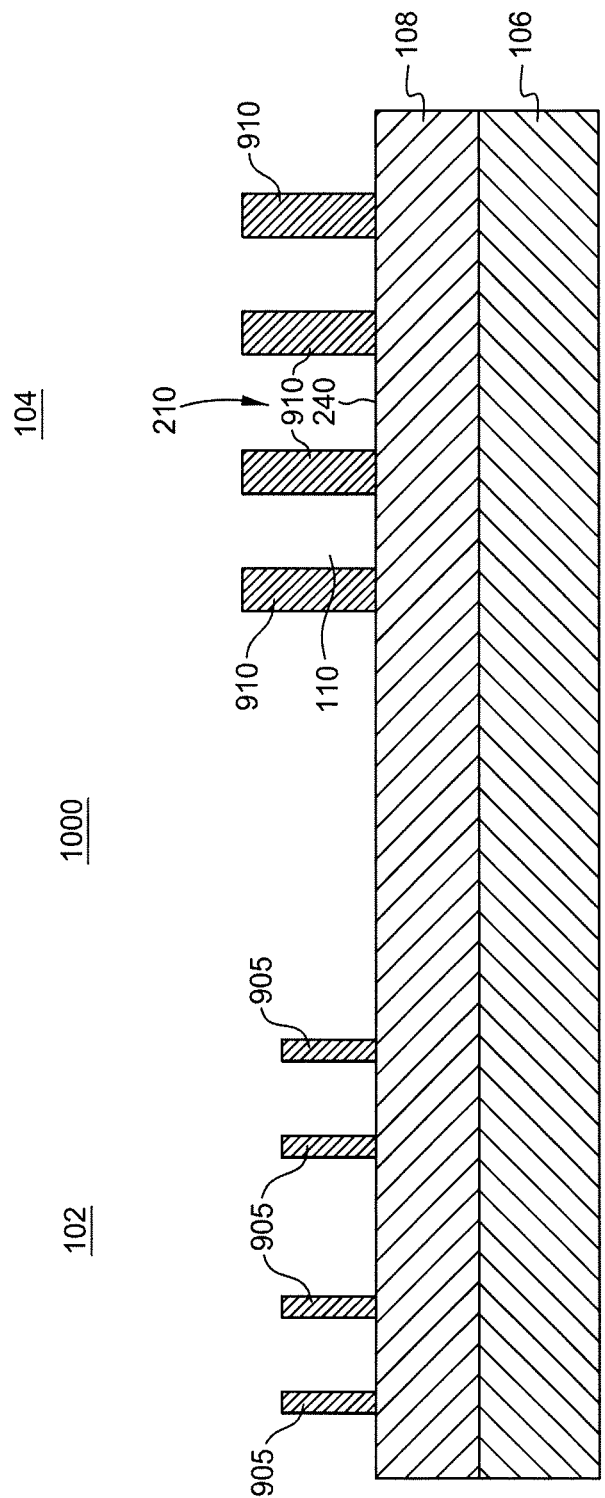
FIG. 10 is a cross-sectional side view of a semiconductor structure corresponding to the semiconductor structure of FIG. 9 after removing the pillars selective to the bottom mandrel layer.

FIG. 9 is a cross-sectional side view of a semiconductor structure 900 corresponding to the semiconductor structure 800 of FIG. 8 after forming spacers 905, 910 along the sidewalls 225 of the pillars 215 and the sidewalls of the pillars 220, respectively. The forming process may employ a deposition process (e.g., CVD or ALD) and an etching process (e.g., RIE). The spacers 905 are located on the inner sidewalls 225 of the pillars 215 within the first trenches 205, rising from the bottom walls 230 located on the bottom mandrel layer 108 and adjoining the sidewalls 225 up to a top surface 915 of the pillars 215. The spacers 910 are located on the outer sidewalls 235 of the pillars 220 internal and external to the second trenches 210 and rise from the bottom walls 240 located on the bottom mandrel layer 108 and adjoin the sidewalls 225 up to the litho-assist layer 112B. The spacers 905, 910 may be made of silicon dioxide (SiO$_2$). The spacers 905 have a smaller width than the spacers 910. The spacers 905 may have a thickness between 10 nm and 30 nm. The wider spacers 910 may have a thickness between 15 nm and 50 nm FIG. 10 is a cross-sectional side view of a semiconductor structure 1000 corresponding to the semiconductor structure 900 of FIG. 9 after removing the pillars 215, 210 selective to the bottom mandrel layer 108. The removal may be effected with an etch process (e.g., RIE).

Figure 11:
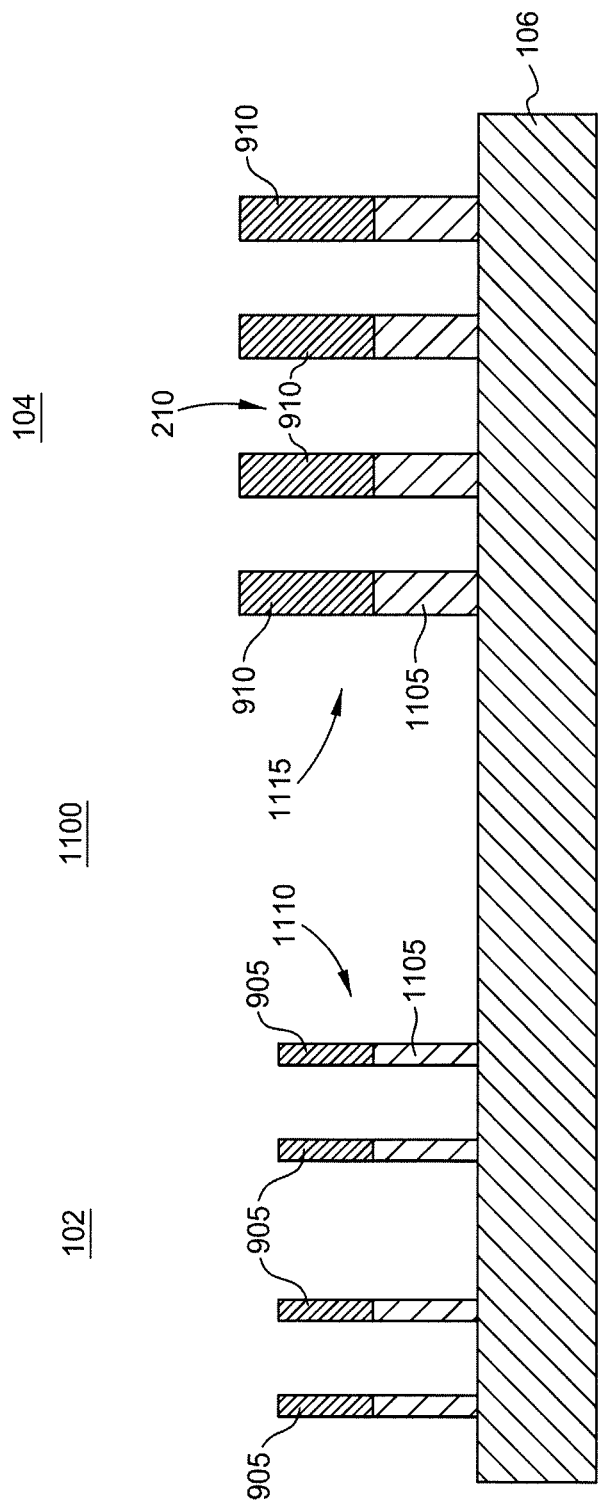
FIG. 11 is a cross-sectional side view of a semiconductor structure corresponding to the semiconductor structure of FIG. 10 after removing the pillars selective to the target etch layer.

FIG. 11 is a cross-sectional side view of a semiconductor structure 1100 corresponding to the semiconductor structure 1000 of FIG. 10 after removing the pillars 210, 215 selective to the target etch layer 106. The removal may be effected with an etch process (e.g., RIE). The spacers 905 and the twice width spacers 910 remain. The bottom mandrel layers 108 remain underlying the spacers 905 and the wide spacers 910 to function as a mask for the underlying bottom mandrel portions 1105 of the pillars 210, 215. The bottom mandrel material may be removed using a reactive ion etch (RIE) process. The newly formed pillars 1110, 1115 each have the same respective pitch as the spacers 905 and the wide spacers 910, respectively.

Figure 12:
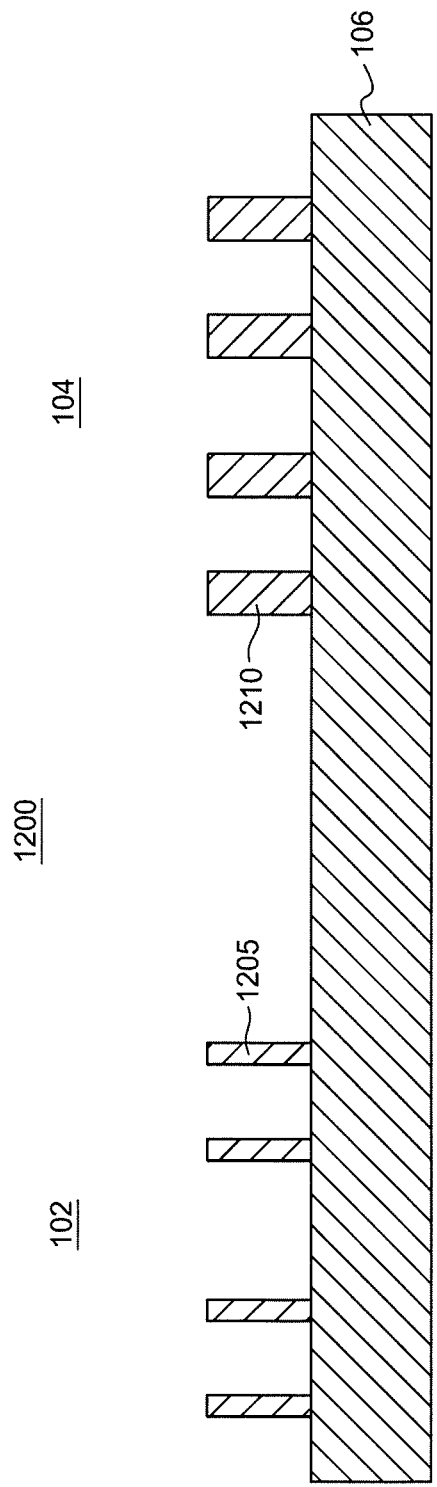
FIG. 12 is a cross-sectional side view of a semiconductor structure corresponding to the semiconductor structure of FIG. 11 after removing spacers from top portions of the pillars.

FIG. 12 is a cross-sectional side view of a semiconductor structure 1200 corresponding to the semiconductor structure 1100 of FIG. 11 after removing spacers 305 from the top portions of the pillars 210 in the SG device region 102 and removing the twice wide spacers 910 from the top portions of the pillars 215 in the EG device region 104. The bottom mandrel layer portions of the pillars 215 and the wide pillars 220 remain to form the pillars 1205, 1210. The spacer material may be removed using a reactive ion etch (RIE) process. The newly formed pillars 1205, 1210 each have the same respective pitch as the spacers 905 and the wide spacers 910.

Figure 13:
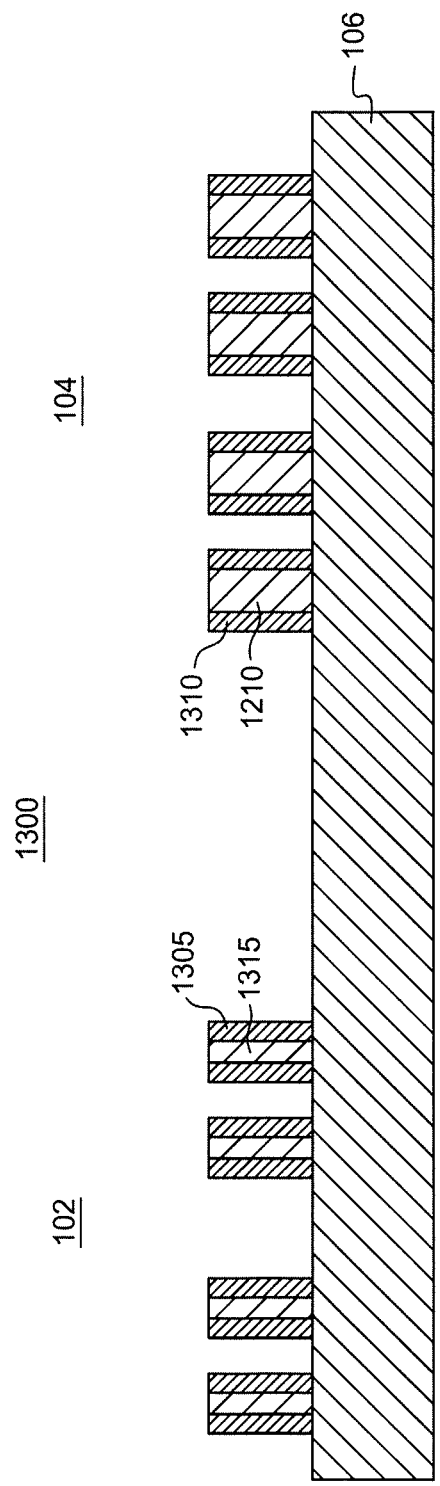
FIG. 13 is a cross-sectional side view of a semiconductor structure corresponding to the semiconductor structure of FIG. 12 after forming second spacers.

FIG. 13 is a cross-sectional side view of a semiconductor structure 1300 corresponding to the semiconductor structure 1200 of FIG. 12 after forming spacers 1305, 1310 along the already present spacers 905 and the wide spacers 910 on the sidewalls 225 of the pillars 215 and the sidewalls 230 of the pillars 220, respectively. The forming process may employ a deposition process (e.g., CVD) and an etching process (e.g., a wet etch process). The spacers 905 are located on the inner sidewalls 225 of the pillars 215 within the first trenches 205 and rise from the bottom walls 230 located on the bottom mandrel layer 108 and adjoin the sidewalls 225 up to a top surface 1315 of the pillars 215. The spacers 1310 are located on the outer sidewalls 235 of the pillars 220 internal and external to the second trenches 210 and rise from the bottom walls 240 located on the bottom mandrel layer 108 and adjoin the sidewalls 225. The spacers 1305, 1310 may be made of silicon dioxide (SiO$_2$). The spacers 1305 and 1310 may have a thickness between 5 nm and 15 nm. The etch back process creates the spacers 1305 and the spacers 1310.

Figure 14:
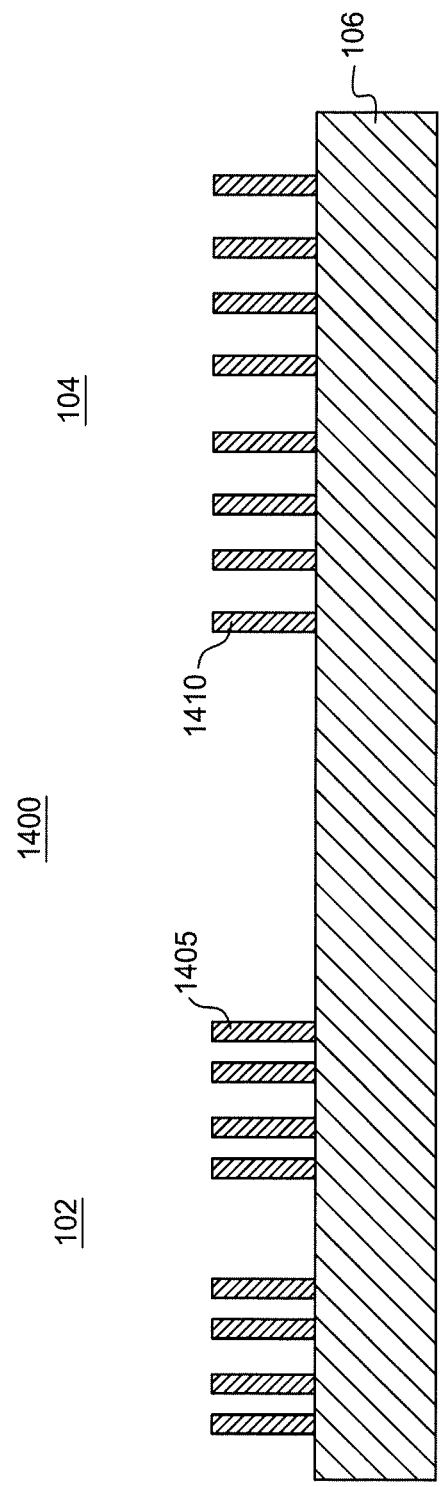
FIG. 14 is a cross-sectional side view of a semiconductor structure corresponding to the semiconductor structure of FIG. 13 after removing the bottom mandrel material from between the second spacers.

FIG. 14 is a cross-sectional side view of a semiconductor structure 1400 corresponding to the semiconductor structure 1300 of FIG. 13 after removing the bottom mandrel material from between the spacers 1305 in the SG device region 102 and from between the twice wide spacers 1310 in the EG device region 104 selective to the target etch layer 106 to leave the spacers 1305, 1310 as pillars 1405, 1410. The removal process may be an etch/pull process. After the etch/pull process, the pitch between the pillars 1405, 1410 is reduced twice again to achieve a four time reduction of pitch in the SG device region 102 and the EG device region 104 with the spacers 1305 having a smaller pitch from the spacers 1310.

Figure 15:
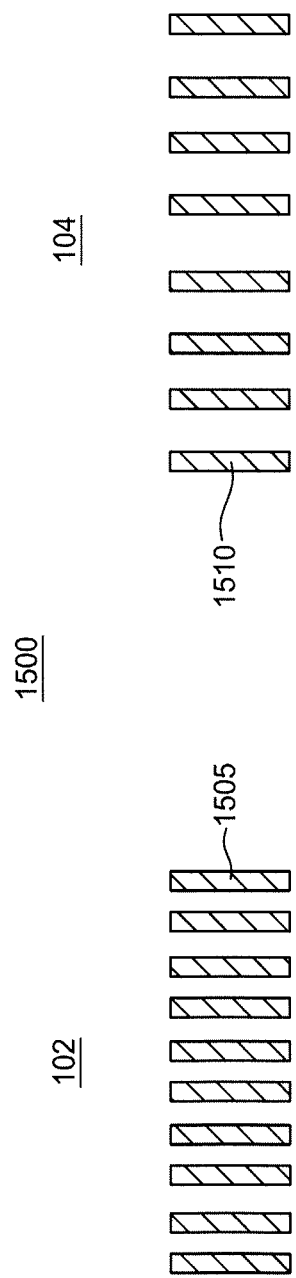
FIG. 15 is a cross-sectional side view of a semiconductor structure corresponding to the semiconductor structure of FIG. 14 after performing a pattern transfer through the target material layer to form fins.

FIG. 15 is a cross-sectional side view of a semiconductor structure 1500 corresponding to the semiconductor structure 1400 of FIG. 14 after performing a pattern transfer through the target etch layer 106 to form fins 1505 in the SG device region 102, and wherein the material of the target etch layer 106 below the now removed spacers 1305, 1310 is all that remains to form fins 1510 in the EG device region 104. A pitch of the fins 1505 is different from the pitch of the fins 1510 in the EG device region 104.

Figure 16:
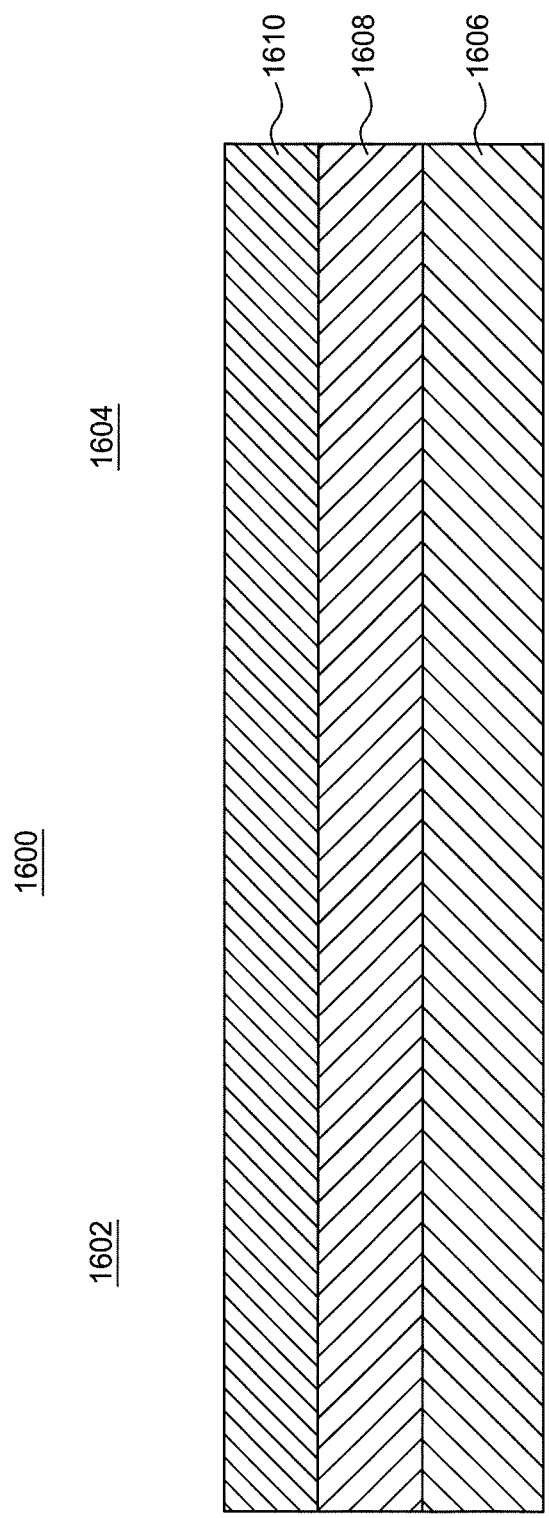
FIG. 16 is a cross-sectional view of an initial semiconductor structure according to a second embodiment to create regions of different device patterning types SAQP and SADP on a substrate having different pitches.

FIG. 16 is a cross-sectional view of an initial semiconductor structure 1600 according to a second embodiment to create regions of different device patterning types SAQP and SADP on a substrate having different pitches. The initial semiconductor structure 1600 is formed over a substrate (not shown for illustrative convenience) in each of the SAQP device region 1602 and the SADP device region 1604. The SAQP device region 1602 is to have a smaller pitch than the SADP device region 1604. Each of device regions 1602, 1604 are patterned at the same time. The initial semiconductor structure 1600 further includes a target etch layer 1606 for forming fins over the substrate (not shown), a bottom mandrel layer 1608 formed over the target etch layer 1606, a top mandrel layer 1610 to be employed in a first spacer patterning step to obtain a two times reduction of pitch and formed over the bottom mandrel layer 1608 to be employed in a second spacer patterning step to obtain a four times reduction of pitch. The target etch layer 1606 is formed of a silicon nitride or silicon material such as Si or SiGe to a thickness of 25 to 45 nanometers (nm). The bottom and top mandrel layers 1608 and 1610 are made of different materials (i.e. heterogeneous). The bottom mandrel layer 1608 is formed of amorphous silicon (a-Si) to a thickness of 40 to 60 nm, and the top mandrel layer 1610 is formed of amorphous carbon (aCarbon) to a thickness of 20 to 40 nm. The layers 1606, 1608, and 1610 can be deposited using any suitable deposition technique, e.g. chemical vapor deposition (CVD) or physical vapor deposition (PVD).

Figure 17:
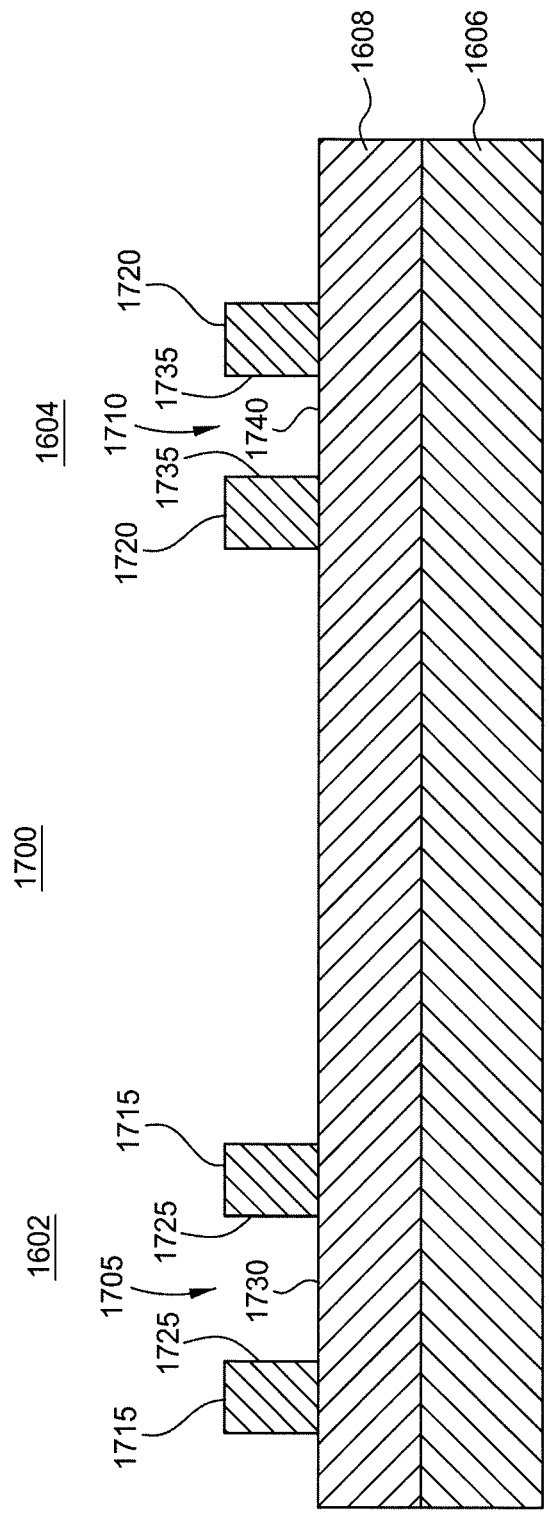
FIG. 17 is a cross-sectional side view of a semiconductor structure corresponding to the initial semiconductor structure of FIG. 16 after forming of first trenches in the SADQ device region and second trenches in the SADP device region

FIG. 17 is a cross-sectional side view of a semiconductor structure 1700 corresponding to the initial semiconductor structure 1600 of FIG. 16 after a forming of first trenches 1705 in the SADO device region 1602 and second trenches 1710 in the SADP device region 1604. The forming process may be lithographic patterning and etching process. The first trenches 1705 have side 1725 and bottom wall 1730 and the second trenches have sidewalls 1735 and bottom wall 1740.

The top mandrel layer 1610 is etched selective to the bottom mandrel layer 1608. The trenches 1705, 1710 alternate with patterned pillars 1715 in the SAQP device region 1602 and 1720 in the SADP device region 1604. The spacing or pitch between the pillars 1715 is larger than that of the pillars 1720. The first trenches 1705 and the second trenches 1710 may be formed using a first etch process, which may be, but is not limited to, e.g. a reactive-ion etch (RIE) process. The pillar pattern and spacing in the SAQP device region 1602 is provided by tone inversion as in FIG. 2 above.

Figure 18:
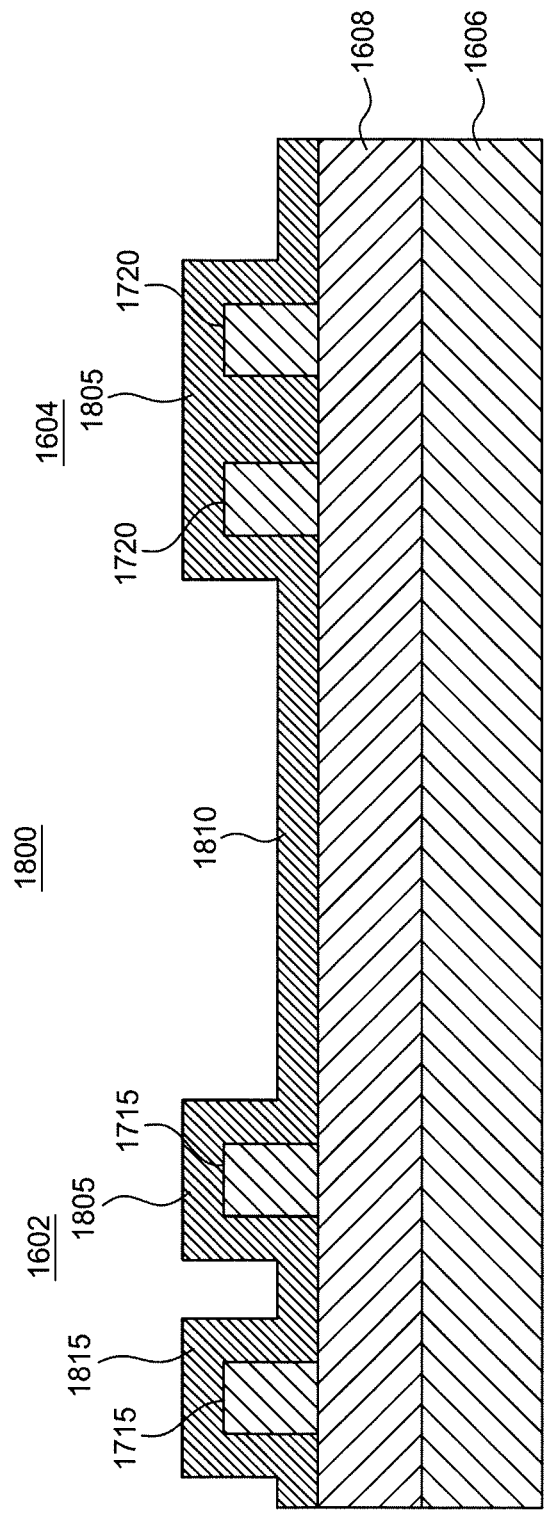
FIG. 18 is a cross-sectional side view of a semiconductor structure corresponding to the semiconductor structure of FIG. 17 after conformally depositing a top spacer layer.

FIG. 18 is a cross-sectional side view of a semiconductor structure 1700 corresponding to the semiconductor structure 1700 of FIG. 17 after conformally depositing a spacer layer 1805 over the pillars 1715 and the trenches 1705 and over a top surface 1810 of the top mandrel layer 1608 in the SAQP device region 1602 and in the SADP device region 1604 to form a top spacer layer 1815. The material of the top spacer layer 1815 may be $SiO_2$.

Figure 19:
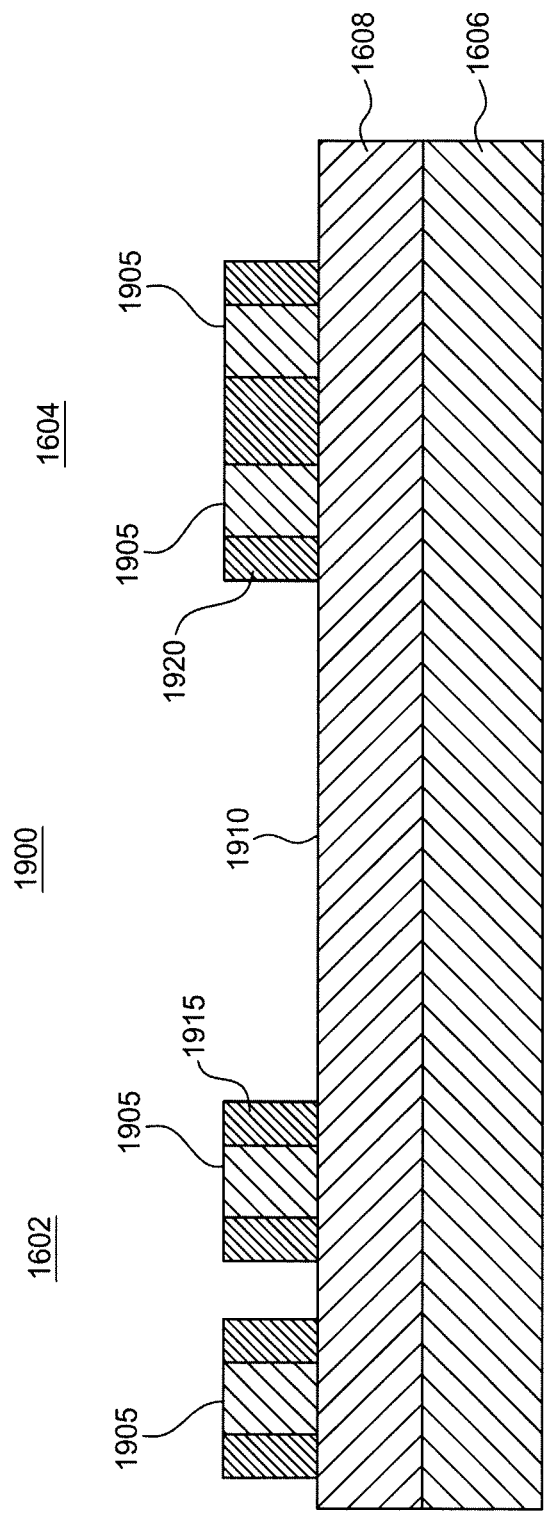
FIG. 19 is a cross-sectional side view of a semiconductor structure corresponding to the semiconductor structure of FIG. 18 after removing the top spacer layer from top and bottom surfaces of pillars.

FIG. 19 is a cross-sectional side view of a semiconductor structure 1900 corresponding to the semiconductor structure 1800 of FIG. 18 after removing the top spacer layer 1815 from top surfaces 1905 of the pillars 1715, 1720 and selective to a top surface 1910 of the bottom mandrel layer 1608. The removal process may be an etch process (e.g., RIE). The etch results in spacers 1915, 1920 formed about the pillars 1715, 1720.

Figure 20:
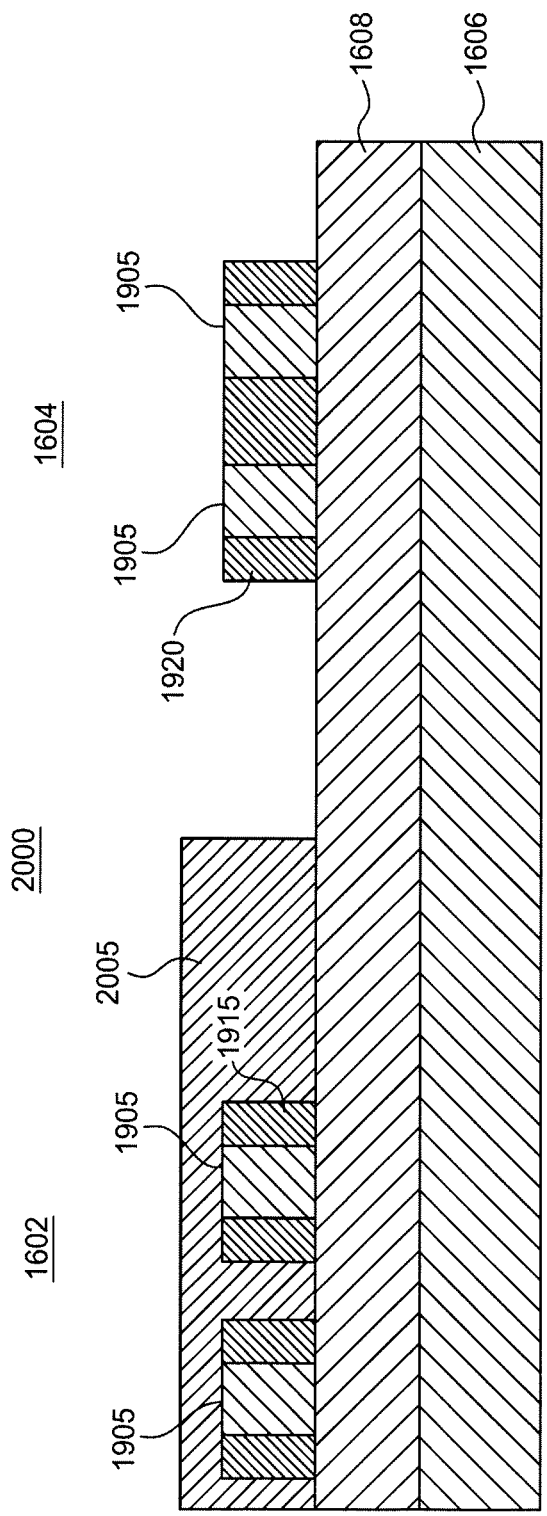
FIG. 20 is a cross-sectional side view of a semiconductor structure corresponding to the semiconductor structure of FIG. 19 after forming an optical planarization layer (OPL) over the pillars.

FIG. 20 is a cross-sectional side view of a semiconductor structure 2000 corresponding to the semiconductor structure 1900 of FIG. 19 after forming an optical planarization layer (OPL) 2005 over the pillars 1715 and a top surface 1910 of the bottom mandrel layer 1608 in the SADP device region 1604 but not the SADP device region 1602. The forming process may be a deposition and block patterning process. The OPL 2005 is made of carbon contained organic materials, which does not have an etch selectivity to (aCarbon) bottom mandrel layer 1608. The OPL 2005 may be formed to a thickness of 200 to 400 nm. The OPL 2005 is etched back from the SAQP device region 1602.

Figure 21:
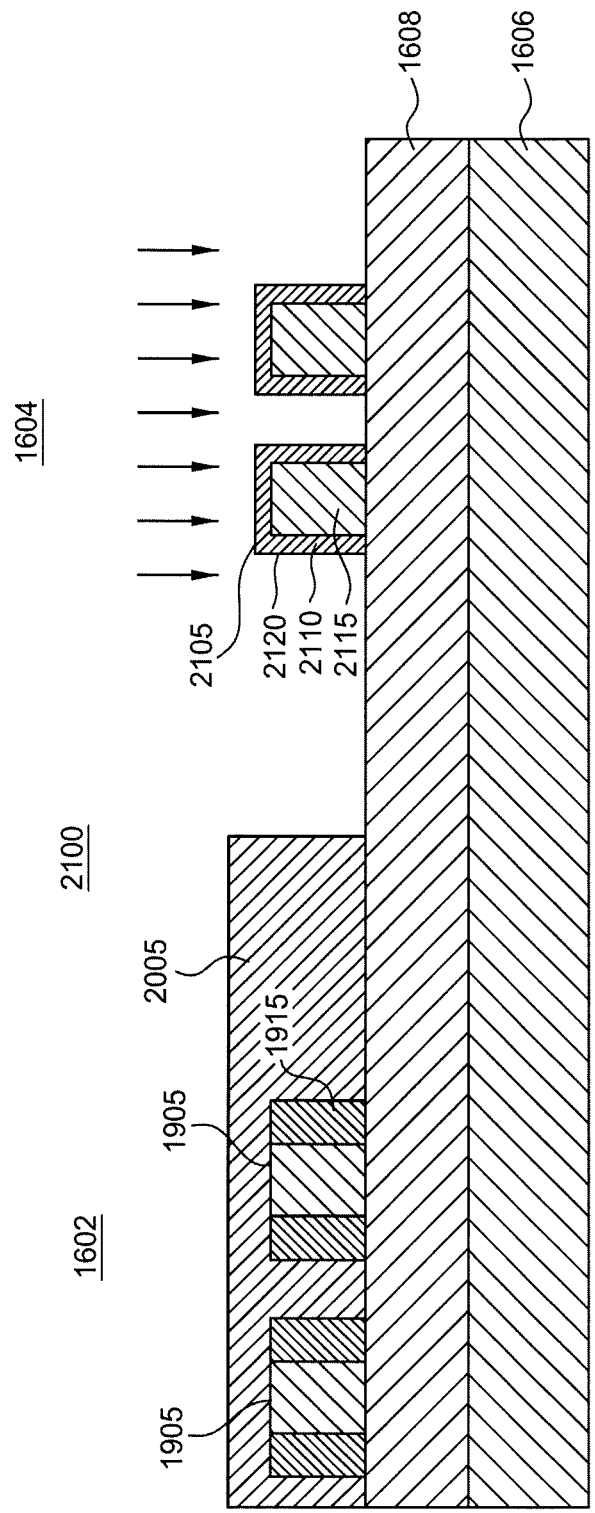
FIG. 21 is a cross-sectional side view of a semiconductor structure corresponding to the semiconductor structure of FIG. 20 after performing an implantation on a surface of SADP device region to get a different etch rate using a plasma doping method.

FIG. 21 is a cross-sectional side view of a semiconductor structure 2100 corresponding to the semiconductor structure 2000 of FIG. 20 after implanting a dopant on the top surfaces 2105 and sidewalls 2110 of the remaining top mandrel layers 2115 to form implanted pillars 2120 in the SADP device region 1604. The implantation may be effected by a plasma doping method. The implantation may be performed using an isotropic PLAD (PLAD is a plasma doping method, which can perform a doping in a lateral direction. The implant species may be B, P, Ar, C, He, As, Sb, N, F, Si). By performing an implantation in the top mandrel layer pillars 1720 in the SADP device region 1604, the top mandrel material is changed to obtain good etch selectivity against the materials of the SADP device region 1604 during top mandrel removal process and OPL removal process.

Figure 22:
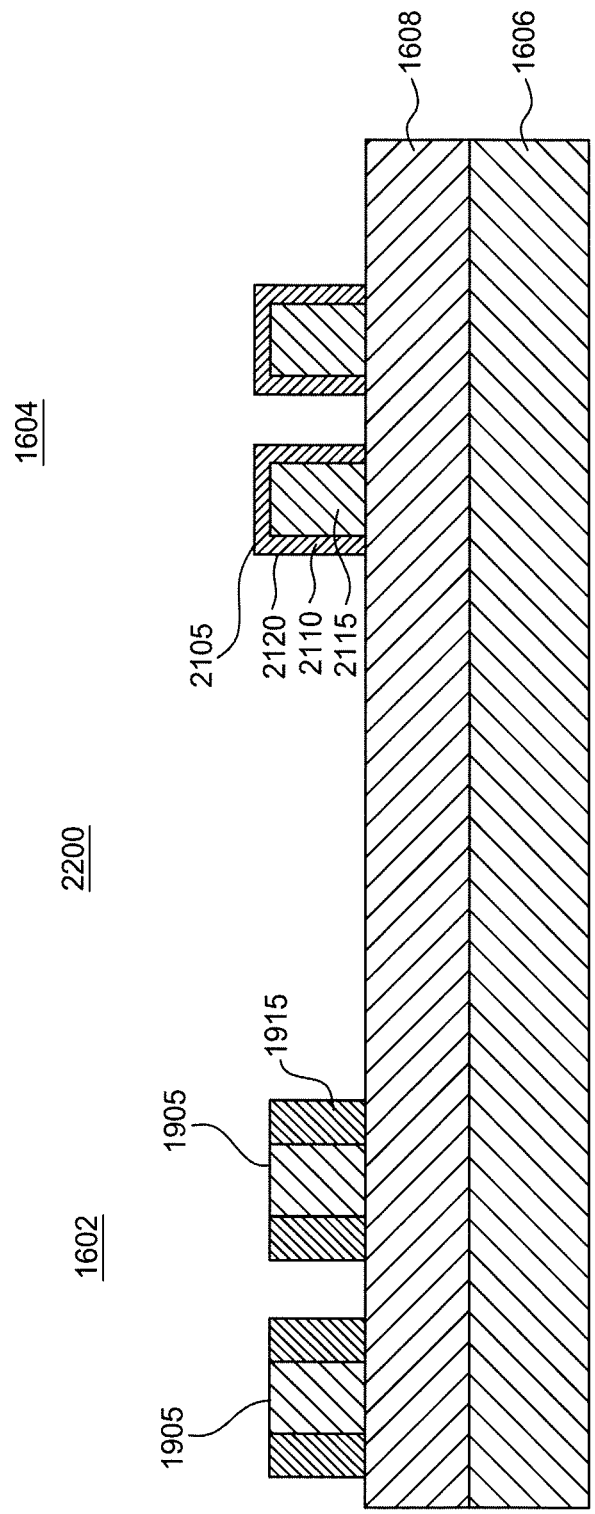
FIG. 22 is a cross-sectional side view of a semiconductor structure corresponding to the semiconductor structure of FIG. 21 after removing the OPL about the pillars.

FIG. 22 is a cross-sectional side view of a semiconductor structure 2200 corresponding to the semiconductor structure 2100 of FIG. 21 after removing the OPL 2005 about the pillars 1715 and the bottom mandrel layer 1608 in the SADQ device region 1602. The OPL 2005 may be removed with RE. The implanted pillars 2120 remain in the SADP device region 1604 protected by the implant material.

Figure 23:
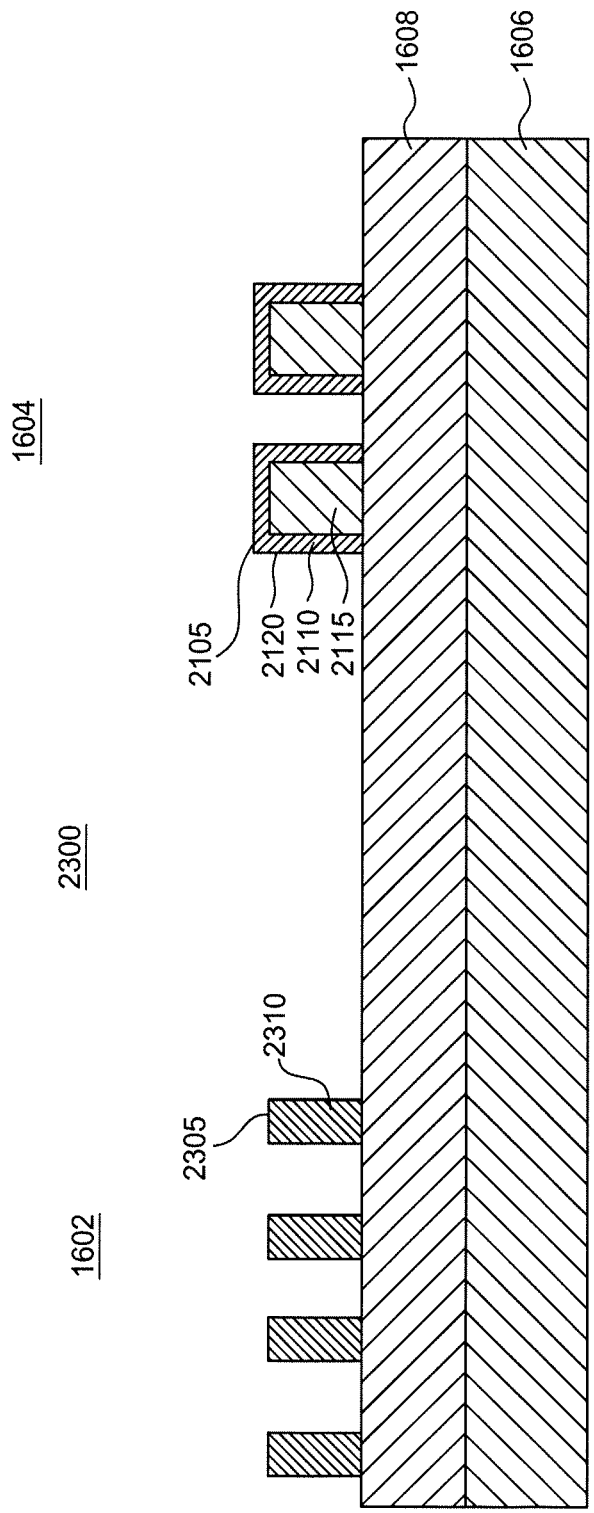
FIG. 23 is a cross-sectional side view of a semiconductor structure corresponding to the semiconductor structure of FIG. 22 after removing the top mandrel material portions of the pillars.

FIG. 23 is a cross-sectional side view of a semiconductor structure 2300 corresponding to the semiconductor structure 2200 of FIG. 22 after removing the top mandrel material portions 2305 of the pillars 1715 selective to the bottom mandrel layer 1608 in the SAQP device region 1602, leaving spacer layers 2310 intact. The removal process may be an etch process (e.g., RIE).

Figure 24:
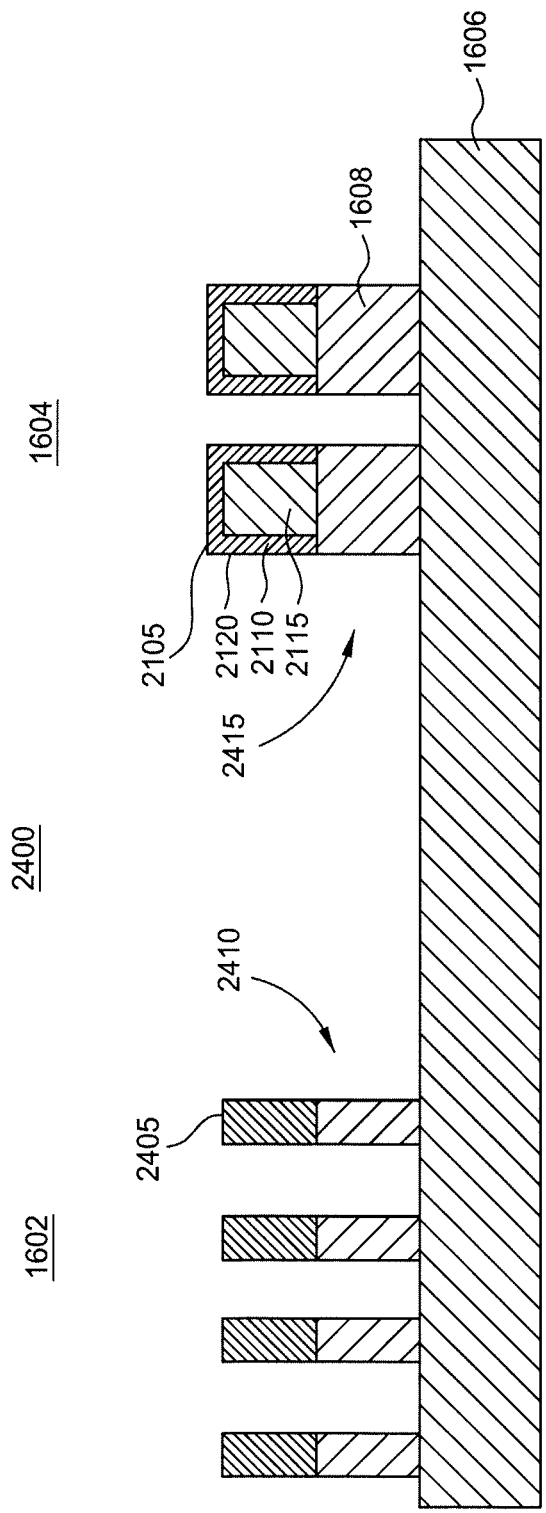
FIG. 24 is a cross-sectional side view of a semiconductor structure corresponding to the semiconductor structure of FIG. 23 after removing the bottom mandrel layer below the spacers.

FIG. 24 is a cross-sectional side view of a semiconductor structure 2400 corresponding to the semiconductor structure 2300 of FIG. 23 after removing the bottom mandrel layer 1608 below the spacers 2405 in the SAQP device region 1602 and below the implanted pillars 2120 in the SADP device region 1604. An RIE process can be employed to remove the bottom mandrel layer 1608 selective to the target etch layer 1606 to leave pillars 2410, 2415.

Figure 25:
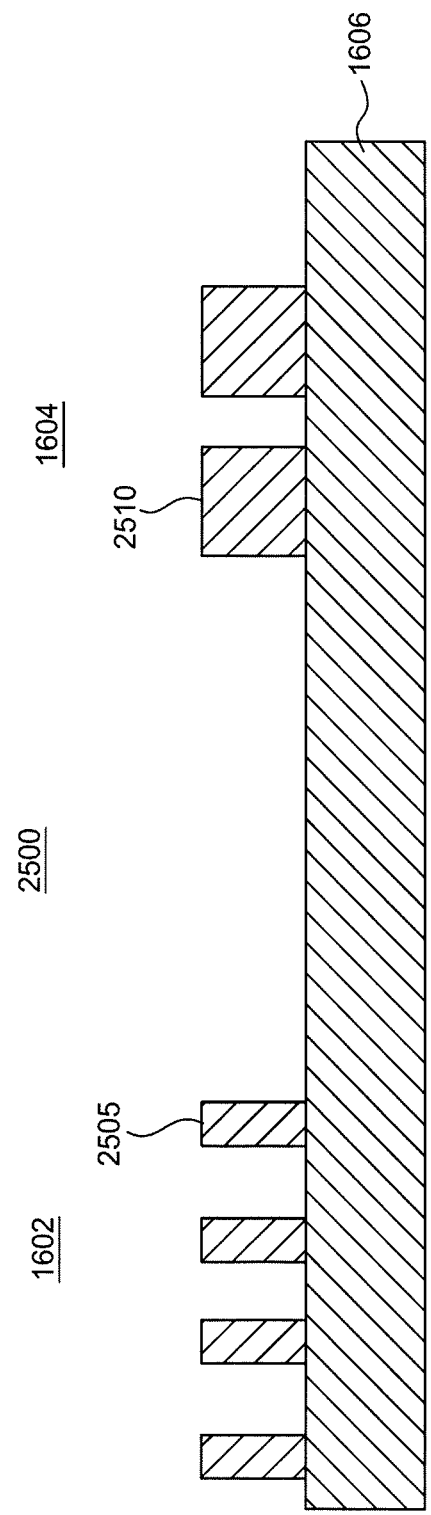
FIG. 25 is a cross-sectional side view of a semiconductor structure corresponding to the semiconductor structure of FIG. 24 after removing spacers from the top portions of the pillars.

FIG. 25 is a cross-sectional side view of a semiconductor structure 2500 corresponding to the semiconductor structure 2400 of FIG. 24 after removing spacers 2405 from the top portions of the pillars 2410 in the SAQP device region 1602 and removing the implanted pillars 2120 in the SADP device region 1604. The bottom mandrel layer portions of the pillars 2410 and the twice wide pillars 2415 remain to form the pillars 2505, 2510. The spacer material may be removed using a reactive ion etch (RIE) process. As the SAQP device region 1602 is spacer patterned, the pitch is smaller than the litho pitch by 2 times. But, SADP device does not go through with spacer patterning (spacer is deposited and removed). Such that, the pitch is same as litho pitch.

Figure 26:
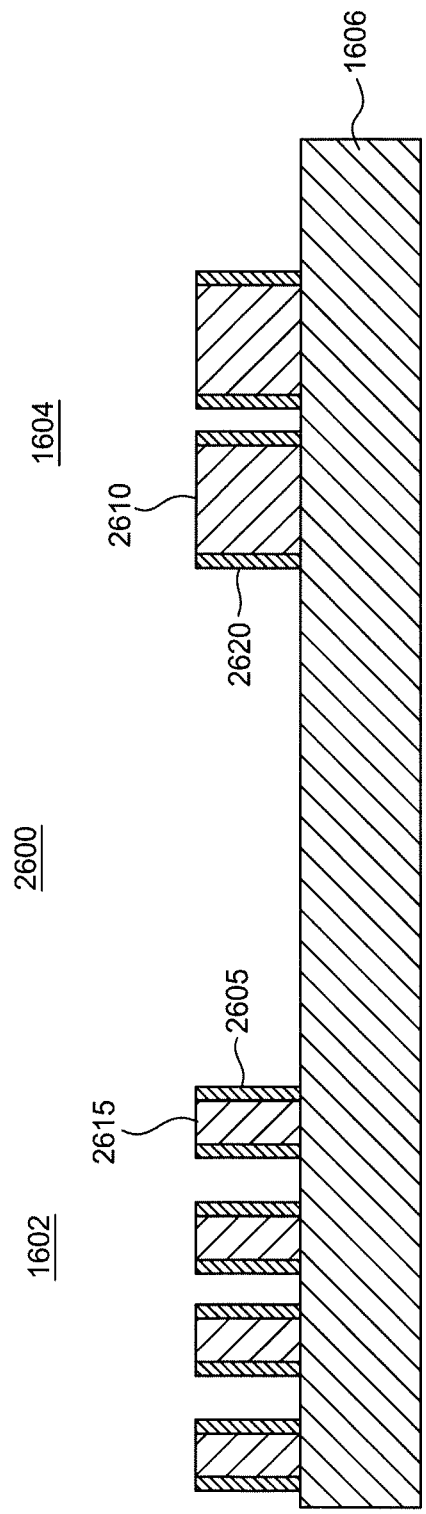
FIG. 26 is a cross-sectional side view of a semiconductor structure corresponding to the semiconductor structure of FIG. 25 after forming spacers along the sidewalls of the pillars.

FIG. 26 is a cross-sectional side view of a semiconductor structure 2600 corresponding to the semiconductor structure 2500 of FIG. 25 after forming spacers 2605, 2610 along the sidewalls 2615 of the pillars 2505 and the sidewalls 2620 of the pillars 2510, respectively. The forming process may be a deposition process and an etch process. The spacers 2605 rise from the bottom mandrel layer 1608 and adjoin the sidewalls 2615, 2620 up to a top surface 2625 of the pillars 2505, 2510. The spacers 2610 are located on the sidewalls 2625 of the pillars 2525, rising from the bottom walls 2630 located on the bottom mandrel layer 1608 and adjoining the sidewalls 2615, 2620. The spacers 2605, 2610 may be made of silicon dioxide ($SiO_2$). The spacers 2605, 2610 may have a thickness between 5 nm and 15 nm. The etch process may employ a RIE etch process to create the spacers 2605, 2610 only to the side.

Figure 27:
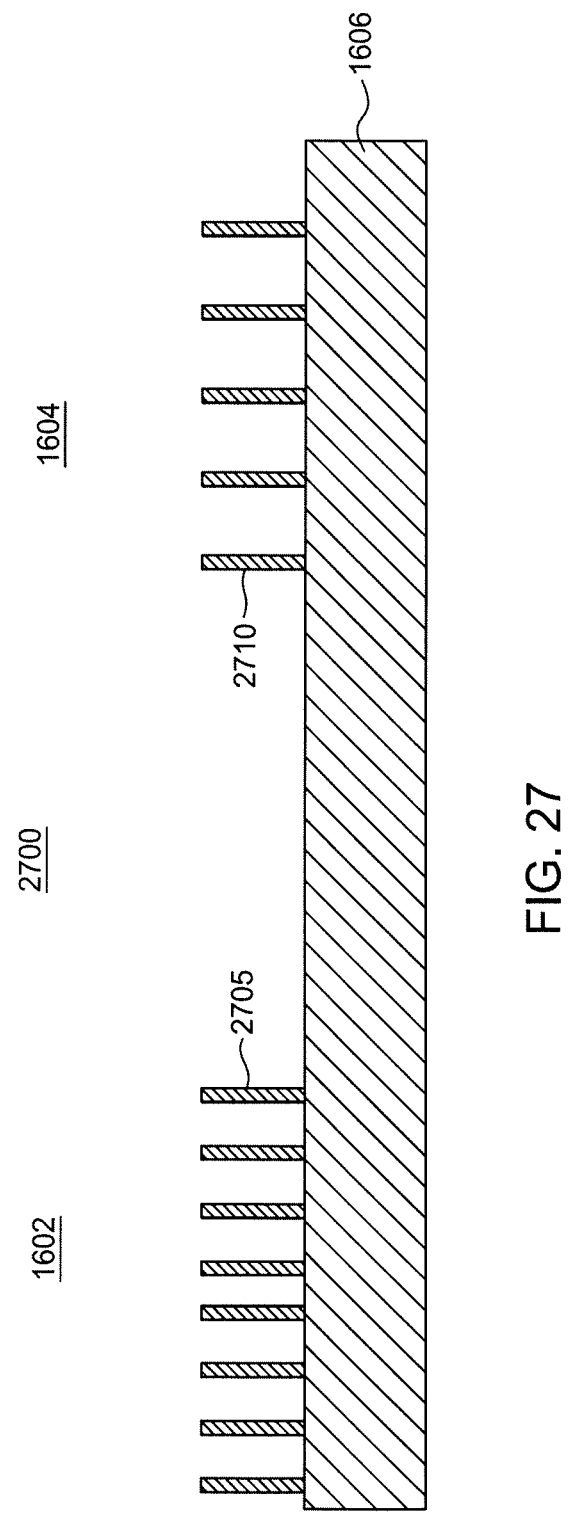
FIG. 27 is a cross-sectional side view of a semiconductor structure corresponding to the semiconductor structure of FIG. 26 after removing the bottom mandrel material from between the spacers.

FIG. 27 is a cross-sectional side view of a semiconductor structure 2700 corresponding to the semiconductor structure 2600 of FIG. 26 after removing the bottom mandrel material from between the spacers 2605 in the SAQP device region 1602 and from between the twice wide spacers 2610 in the SADP device region 1604 selective to the target etch layer 1606 to leave the spacers 2605, 2610 as pillars 2705, 2710. The removal process may be an etch/pull process. After performing the etch/pull process, the pitch between the pillars 2705, 2710 is reduced twice again to achieve a four time reduction of pitch in the SAQP device region 1602 with respect to the SADP device region 1604 with the pillars 2705 having a smaller pitch than the pillars 2710.

Figure 28:
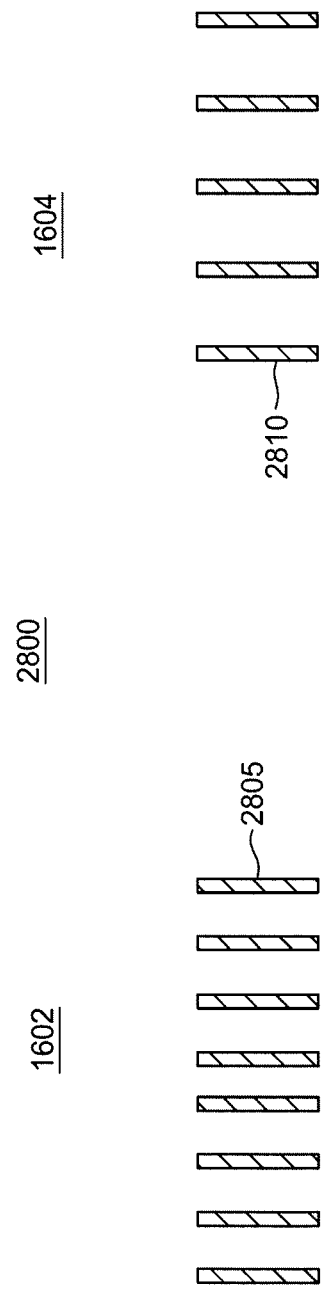
FIG. 28 is a cross-sectional side view of a semiconductor structure corresponding to the semiconductor structure of FIG. 27 after performing a pattern transfer through the target etch layer to form fins.

FIG. 28 is a cross-sectional side view of a semiconductor structure 2800 corresponding to the semiconductor structure 2700 of FIG. 27 after performing a pattern transfer through the target etch layer 1606 to form the fins 2805 in the SAQP device region 1602 wherein the target device material below the now removed spacers 2710 is all that remains to form fins 2810 in the SADP device region 1604. The pitch of the fins 2805 and is different from the pitch of the fins 2810.

According to one embodiment, given the nature of initial semiconductor structure 100 and the subsequent deposition and etch techniques, a hard mask can be completely omitted in performing one or more, e.g. all, of the above techniques and/or steps. Integration of SADP devices with EG devices is simplified by employing common patterning on SAQP area and SADP. Two different pitch sizes can be patterned (one is for SAQP, and another is for SADP or alternatively, one is for SG devices, and another is for EG devices).

Further, an inexpensive block patterning process may be employed. Still further, the embodiments provide for simple scaling and pitch walking control for multiple pitches.

While the foregoing is directed to examples of the present disclosure, other and further examples of the disclosure may be devised without departing from the basic scope thereof, and the scope thereof is determined by the claims that follow.

What is claimed is:

1. A method for creating regions of different device types on a substrate having different pitches, comprising:
   dividing a substrate into a first device type region and a second device type region;
   forming a target etch layer on the substrate;
   forming a bottom mandrel layer on the target etch layer;
   forming a plurality of alternating first pillars of a top mandrel material and first trenches between the first pillars on the bottom mandrel layer in the first device type region, the plurality of first pillars having a first pitch;
   forming a plurality of alternating second pillars of the top mandrel material and second trenches between the second pillars on the bottom mandrel layer in the second device type region, the plurality of second pillars having a second pitch; and
   depositing tone inversion material in the first trenches.

2. The method of claim 1, further comprising forming spacers lining sidewalls of each of the plurality of second pillars in the second device region.

3. The method of claim 1, further comprising depositing a litho-assist layer on each of the plurality of second pillars.

4. The method of claim 1, further comprising conformally depositing an optical planarization layer over the second pillars and a top surface of the bottom mandrel layer in the second device type region.

5. The method of claim 1, further comprising conformally depositing the tone inversion material over top surfaces of the plurality of first pillars and over an optical planarization layer overlying the plurality of second pillars.

6. The method of claim 5, further comprising removing the tone inversion material from the top surfaces of the plurality of first pillars and over the optical planarization layer overlying the plurality of second pillars while leaving the tone inversion material in the first trenches.

7. The method of claim 6, further comprising removing the plurality of first pillars while leaving the tone inversion material disposed on the bottom mandrel layer in the first device type region and removing the optical planarization layer overlying the plurality of second pillars and over the bottom mandrel layer in the second device type region.

8. The method of claim 1, further comprising forming first spacers about each of the plurality of first pillars and second spacers about each of the plurality of second pillars to render the second pitch about half the first pitch.

9. The method of claim 8, further comprising removing the plurality of first pillars and the plurality of second pillars selective to the first spacers, the second spacers, and the bottom mandrel layer.

10. The method of claim 8, further comprising:
   removing the bottom mandrel layer selective to the first spacers and the second spacers, wherein bottom mandrel portions remain underlying the first spacers and the second spacers to form first bottom mandrel pillars and second bottom mandrel pillars, respectively;
   forming third spacers along sidewalls of the first bottom mandrel pillars and forming fourth spacers about the second bottom mandrel pillars;
   removing the first bottom mandrel pillars and the second bottom mandrel pillars to leave third spacer pillars in the first device region and second spacer pillars in the second device region; and
   performing a pattern transfer through the target etch layer to form a first plurality of fins in the first device type region and a second plurality of fins in the second device type region to render the second pitch about one quarter of the first pitch.

* * * * *